(12) United States Patent
Jindo et al.

(10) Patent No.: US 9,257,315 B2
(45) Date of Patent: *Feb. 9, 2016

(54) COOLING PLATE, METHOD FOR MANUFACTURING THE SAME, AND MEMBER FOR SEMICONDUCTOR MANUFACTURING APPARATUS

(71) Applicant: NGK Insulators, Ltd., Nagoya (JP)

(72) Inventors: Asumi Jindo, Okazaki (JP); Katsuhiro Inoue, Ama-Gun (JP); Yuji Katsuda, Tsushima (JP); Takashi Kataigi, Handa (JP); Shingo Amano, Chita-Gun (JP); Hiroya Sugimoto, Chiryu (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/515,800

(22) Filed: Oct. 16, 2014

(65) Prior Publication Data
US 2015/0036261 A1 Feb. 5, 2015

Related U.S. Application Data

(63) Continuation of application No. PCT/JP2014/055813, filed on Mar. 6, 2014.

(30) Foreign Application Priority Data

Mar. 25, 2013 (JP) .................................. 2013-061856

(51) Int. Cl.
*B23K 31/02* (2006.01)
*C04B 35/653* (2006.01)
(Continued)

(52) U.S. Cl.
CPC .......... *H01L 21/67109* (2013.01); *B21D 53/02* (2013.01); *B32B 9/005* (2013.01);
(Continued)

(58) Field of Classification Search
CPC ............ C04B 35/5611; C04B 35/5615; C04B 35/565; C04B 2235/3826; C04B 35/575; C04B 35/62635; B32B 9/005; B32B 37/10; B32B 38/0012; B21D 53/02; H01L 21/68757

USPC .......... 264/332; 428/219, 446, 698, 699, 450, 428/615, 621, 622; 501/88, 91, 93; 165/80.4, 104.28, 185; 228/121, 174, 228/183

See application file for complete search history.

(56) References Cited

U.S. PATENT DOCUMENTS

4,729,972 A * 3/1988 Kodama et al. ................ 501/91
5,057,163 A 10/1991 Barnett et al.

(Continued)

FOREIGN PATENT DOCUMENTS

| CN | 101269966 A | 9/2008 |
| JP | 02-077172 A1 | 3/1990 |

(Continued)

OTHER PUBLICATIONS

Qin et al., "Microstructure Characterization and Mechanical Properties of TiSi2-SiC-Ti3SiC2 Composites prepared by Spark Plasma Sintering", Materials Transactions, vol. 47, No. 3, 2006, pp. 845-848.*

(Continued)

*Primary Examiner* — Jonathan Langman
(74) *Attorney, Agent, or Firm* — Burr & Brown, PLLC

(57) ABSTRACT

A member for a semiconductor manufacturing apparatus includes an AlN electrostatic chuck, a cooling plate, and a cooling plate-chuck bonding layer. The cooling plate includes first to third substrates, a first metal bonding layer between the first and second substrates, a second metal bonding layer between the second and third substrates, and a refrigerant path. The first to third substrates are formed of a dense composite material containing SiC, $Ti_3SiC_2$, and TiC. The metal bonding layers are formed by thermal compression bonding of the substrates with an Al—Si—Mg metal bonding material interposed between the first and second substrates and between the second and third substrates.

22 Claims, 9 Drawing Sheets

(51) Int. Cl.

| | | |
|---|---|---|
| B32B 9/06 | (2006.01) | |
| B32B 15/04 | (2006.01) | |
| B32B 15/00 | (2006.01) | |
| F28F 7/00 | (2006.01) | |
| F28D 15/00 | (2006.01) | |
| H01L 21/67 | (2006.01) | |
| B32B 9/00 | (2006.01) | |
| C04B 35/56 | (2006.01) | |
| C04B 35/575 | (2006.01) | |
| C04B 35/626 | (2006.01) | |
| C04B 37/00 | (2006.01) | |
| B21D 53/02 | (2006.01) | |
| B32B 37/10 | (2006.01) | |
| B32B 38/00 | (2006.01) | |
| H01L 21/683 | (2006.01) | |
| H01L 21/687 | (2006.01) | |

(52) U.S. Cl.
CPC ............ *B32B 37/10* (2013.01); *B32B 38/0012* (2013.01); *C04B 35/5615* (2013.01); *C04B 35/575* (2013.01); *C04B 35/62635* (2013.01); *C04B 37/006* (2013.01); *H01L 21/6833* (2013.01); *B32B 2311/00* (2013.01); *B32B 2311/24* (2013.01); *B32B 2315/02* (2013.01); *C04B 2235/3826* (2013.01); *C04B 2235/3843* (2013.01); *C04B 2235/3891* (2013.01); *C04B 2235/5436* (2013.01); *C04B 2235/5472* (2013.01); *C04B 2235/656* (2013.01); *C04B 2235/77* (2013.01); *C04B 2235/80* (2013.01); *C04B 2235/96* (2013.01); *C04B 2235/9607* (2013.01); *C04B 2237/365* (2013.01); *C04B 2237/366* (2013.01); *C04B 2237/402* (2013.01); *C04B 2237/708* (2013.01); *H01L 21/6831* (2013.01); *H01L 21/68757* (2013.01)

(56) References Cited

U.S. PATENT DOCUMENTS

| | | | | |
|---|---|---|---|---|
| 5,500,394 | A | * | 3/1996 | Kondakov ................ 501/89 |
| 5,942,455 | A | * | 8/1999 | Barsoum et al. ............ 501/91 |
| 2003/0038166 | A1 | * | 2/2003 | Gasse ................... 228/247 |
| 2006/0169688 | A1 | | 8/2006 | Mori et al. |
| 2009/0280299 | A1 | * | 11/2009 | Ferrrato ................ 428/157 |

FOREIGN PATENT DOCUMENTS

| | | | | |
|---|---|---|---|---|
| JP | 2006-143580 | A1 | 6/2006 | |
| JP | 2006-196864 | A1 | 7/2006 | |
| JP | 2007-261830 | | * 10/2007 | ............. C04B 35/56 |
| JP | 2007-261830 | A1 | 10/2007 | |
| JP | 2008-071845 | A1 | 3/2008 | |
| JP | 2008-162875 | | * 8/2008 | ............. C04B 35/56 |

OTHER PUBLICATIONS

Tang et al., "Ti3SiC2-64Volume percent SiC", Journal of Inorganic Materials, vol. 24, No. 4, 2009, pp. 821-826.*
Mogilevsky et al., "Toughening of SiC with Ti3SiC2 Particles", Journal of the American ceramic Society, vol. 89, No. 2, 2006, pp. 633-637.*
STIC Search conducted by Julia Wang, technical Searcher EIC 1700 on Jun. 18, 2015.*
International Search Report and Written Opinion (Application No. PCT/JP2014/055813) dated Jun. 3, 2014 (with English translation).
U.S. Appl. No. 14/515,736, filed Oct. 16, 2014, Jindo et al.
U.S. Appl. No. 14/220,289, filed Mar. 20, 2014, Jindo et al.

* cited by examiner (a)

(b)

COOLING PLATE, METHOD FOR MANUFACTURING THE SAME, AND MEMBER FOR SEMICONDUCTOR MANUFACTURING APPARATUS

BACKGROUND ART

1. Field of Invention

The present invention relates to a cooling plate, a method for manufacturing the cooling plate, and a member for a semiconductor manufacturing apparatus.

2. Description of Related Art

Electrostatic chucks are heated to high temperatures in a semiconductor process and have a cooling plate for heat dissipation. In this case, the material of the electrostatic chucks may be aluminum nitride, the material of the cooling plate may be aluminum, and a resin may be used as a bonding material. There is a very large difference in linear thermal expansion coefficient between aluminum nitride and aluminum. For example, aluminum nitride has a linear thermal expansion coefficient of 5.0 ppm/K (RT-800° C.: Uchida Rokakuho "Seramikku no butsuri (Physics of ceramics)"), and aluminum has a linear thermal expansion coefficient of 31.1 ppm/K (RT-800° C.: "Shinpen netsubussei handobukku (Thermophysical properties handbook new edition)", edited by Japan Society of Thermophysical Properties). In such electrostatic chucks, soft resins used as bonding materials can relieve stress resulting from a difference in linear thermal expansion coefficient.

CITATION LIST

Patent Literature

PTL 1: Japanese Unexamined Patent Application Publication No. 2006-143580

SUMMARY OF INVENTION

Technical Problem

Although resins are used as bonding materials in these electrostatic chucks, resins are organic materials and therefore have low heat dissipation ability and decompose easily at high temperatures. It is therefore generally difficult to use resins in a high temperature process. Thus, metals were found to be effective as heat dissipation bonding materials that replace resins. A bonding method using a metal is referred to as metal bonding. For example, aluminum is known as a bonding material for metal bonding.

However, unlike resins, bonding materials for metal bonding, that is, metals are stiff and cannot relieve stress resulting from a large difference in linear thermal expansion coefficient between an electrostatic chuck and a cooling plate. Thus, there is a demand for the development of a cooling plate material suitable for metal bonding with an electrostatic chuck, that is, a new material that has a small difference in linear thermal expansion coefficient, from aluminum nitride and has characteristics required for cooling plates. The characteristics required for cooling plates include high thermal conductivity in order to maintain heat dissipation ability, high denseness that allows the passage of a coolant, and high strength that allows processing.

The present invention has been made to solve such problems. It is a principal object of the present, invention to provide a cooling plate for cooling an AlN ceramic member, the cooling plate having an internal refrigerant path and having a very small difference in linear thermal expansion coefficient from AlN and sufficiently high thermal conductivity, denseness, and strength.

Solution to Problem

The present invention provides a cooling plate for cooling an AlN ceramic member, the cooling plate having an internal refrigerant path and including a first substrate formed of a dense composite material, the dense composite material containing the following three compounds with the highest contents: silicon carbide, titanium silicon, carbide, and titanium carbide, in descending order of their contents, the silicon carbide content being in the range of 51 to 68 mass %, the dense composite material containing no titanium silicide, the open porosity of the dense composite material being 1% or less, a second substrate formed of the dense composite material and having a punched portion, the punched portion having the same shape as the refrigerant path, a third substrate formed of the dense composite material, a first metal bonding layer between the first substrate and the second substrate formed by thermal compression bonding of the first substrate and the second substrate with a metal bonding material interposed therebetween, and a second metal bonding layer between, the second substrate and the third substrate formed by thermal compression bonding of the second substrate and the third substrate with a metal bonding material interposed therebetween.

Alternatively, the cooling plate includes a first substrate formed of a dense composite material, the dense composite material containing the following three compounds with the highest contents: silicon carbide, titanium silicon carbide, and titanium carbide, in descending order of their contents, the silicon carbide content being in the range of 5.1 to 68 mass %, the dense composite material containing no titanium silicide, the open porosity of the dense composite material being 1% or less, a second substrate formed of the dense composite material and having a groove for the refrigerant path on a surface thereof facing the first substrate, and a metal bonding layer between the first substrate and the surface of the second substrate in which the groove is formed, the metal bonding layer being formed by thermal compression, bonding of the first substrate and the second substrate with, a metal bonding material interposed therebetween.

In the cooling plate, the substrates bonded via the metal bonding layer are formed of the dense composite material. The dense composite material has a very small difference in linear thermal expansion coefficient from AlN and has sufficiently high thermal conductivity, denseness, and strength. Thus, a member for a semiconductor manufacturing apparatus manufactured by bonding such a cooling plate to an AlN ceramic member has a long life While maintaining high heat dissipation performance without separation between the cooling plate and the AlN ceramic member even when the member is repeatedly used between low temperatures and high temperatures. Substrates formed of the dense composite material are difficult to bond together by electron-beam welding. Substrates bonded together using a resin binder have low cooling performance. In the present invention, however, substrates can be relatively easily bonded together by thermal compression bonding (hereinafter abbreviated to TCB) using a metal bonding material and have high cooling performance.

In the cooling plate of the present invention, it is preferable that the metal bonding layer contains as the metal bonding material an aluminum alloy bonding material containing Mg or Si and Mg and is formed by thermal compression bonding at a temperature lower than or equal to the solidus temperature of the bonding material. By this, higher cooling performance can be achieved.

In the cooling plate of the present invention, it is preferable that the titanium silicon carbide content of the dense composite material is in the range of 23 to 40 mass %, and the titanium carbide content of the dense composite material ranges from 4 to 12 mass %. It is preferable that at least one of the titanium silicon carbide and the titanium carbide in the dense composite material is disposed between the silicon carbide particles and covers the surface of the silicon carbide particles. It is preferable that the difference in average linear thermal expansion coefficient between the dense composite material and AlN is 0.5 ppm/K or less at a temperature in the range of 40° C. to 570° C. It is preferable that the dense composite material has an average linear thermal expansion coefficient in the range of 5.4 to 6.0 ppm/K at a temperature in the range of 40° C. to 570° C. it is preferable that the dense composite material has a thermal conductivity of 100 W/m·K or more and a four-point bending strength of 300 MPa or more.

The present invention provides a method for manufacturing a cooling plate for cooling an AlN ceramic member, the cooling plate having an internal refrigerant path, the method including the steps of:

(a) forming first to third substrates from a dense composite material, the dense composite material containing the following three compounds with the highest contents: silicon carbide, titanium silicon carbide, and titanium carbide, in descending order of their contents, the silicon carbide content being in the range of 51 to 68 mass %, the dense composite material containing no titanium silicide, the open porosity of the dense composite material being 1% or less;

(b) forming a punched portion in the second substrate by punching the second, substrate from one surface to the other surface of the second substrate such that the punched portion has the same shape as the refrigerant path; and (c) performing thermal compression bonding of the first to third substrates with a metal bonding material interposed between the first substrate and one surface of the second substrate and between the third substrate and the other surface of the second substrate.

The present invention also provides a method for manufacturing a cooling plate for cooling an AlN ceramic member, the cooling plate having an internal refrigerant path, the method including the steps of:

(a) forming first and second substrates from a dense composite material, the dense composite material containing the following three compounds with the highest contents: silicon, carbide, titanium, silicon carbide, and titanium, carbide, in descending order of their contents, the silicon carbide content being in the range of 51 to 68 mass %, the dense composite material containing no titanium silicide, the open porosity of the dense composite material being 1% or less;

(b) forming a groove for the refrigerant, path in one surface of the second, substrate; and (c) performing thermal compression bonding of the first substrate and the second substrate with a metal bonding material interposed between the first substrate and the surface of the second substrate in which the groove is formed.

With the method for manufacturing a cooling plate according to the present invention, the cooling plate described above can be easily manufactured. Substrates formed of the dense composite material are difficult to bond together by electron-beam welding. Substrates bonded together using a resin binder have low cooling performance. In the present invention, however, substrates can be relatively easily bonded together by thermal compression bonding using a metal bonding material and have high cooling performance.

In the method for manufacturing a cooling plate of the present invention, it is preferable that the metal bonding material in the step (c) is an aluminum alloy bonding material containing Mg or Si and Mg, and the thermal compression, bonding is performed at temperature lower than or equal to the solidus temperature of the bonding material. By this, a cooling plate having higher cooling performance can be obtained.

The present invention also provides a member for a semiconductor manufacturing apparatus, including:

an AlN electrostatic chuck including an electrostatic electrode and a heater electrode the cooling plate according to any one of claims 1 to 8; and a cooling plate-chuck bonding layer formed by thermal compression, bonding of the first substrate and the electrostatic chuck with a metal bonding material interposed between a surface of the first substrate of the cooling plate and the electrostatic chuck.

The member for a semiconductor manufacturing apparatus of the parent invention has a long life while maintaining high heat dissipation performance without separation between the cooling plate and the AlN ceramic member even when the member is repeatedly used between low temperatures and high temperatures. And, heat from die electrostatic chuck can be efficiently dissipated to the cooling plate.

In the member for a semiconductor manufacturing apparatus of the present invention, it is preferable that the cooling plate-chuck bonding layer contains as the metal bonding material an aluminum alloy bonding material containing Mg or Si and Mg and is formed by thermal compression bonding at a temperature lower than or equal to the solidus temperature of the bonding material.

DETAILED DESCRIPTION OF THE INVENTION

[Member for Semiconductor Manufacturing Apparatus— First Embodiment]

Figure 1:
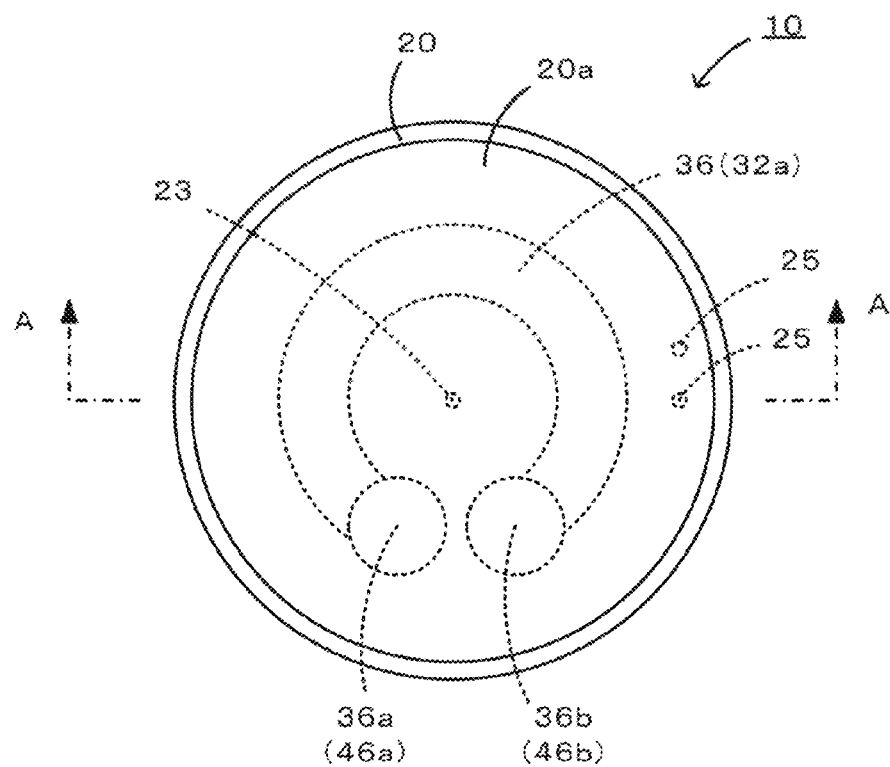
FIG. 1 is a plan view of a member 10 for a semiconductor manufacturing apparatus.
Figure 2:
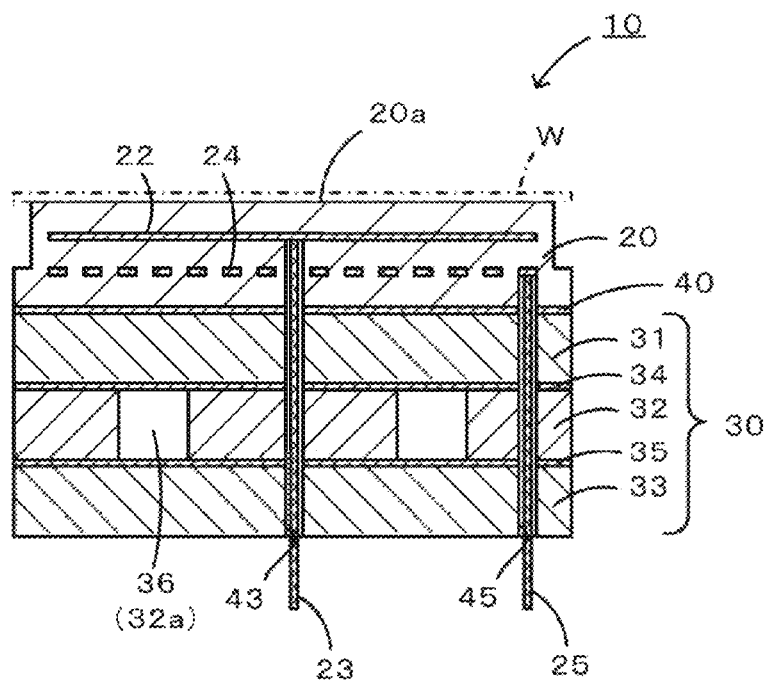
FIG. 2 is a cross-sectional view taken along the line A-A of FIG. 1.

A member 10 for a semiconductor manufacturing apparatus according to a first embodiment will be described below. FIG. 1 is a plan view of the member 10 for a semiconductor manufacturing apparatus, and FIG. 2 is a cross-sectional view taken along the line A-A of FIG. 1.

The member 10 for a semiconductor manufacturing apparatus includes an AlN electrostatic chuck 20 for adsorbing a silicon wafer W to be subjected to plasma processing, a cooling plate 30 formed of a dense composite material having substantially the same linear thermal expansion coefficient as AlN, and a cooling plate-chuck bonding layer 40 for bonding between the electrostatic chuck 20 and the cooling plate 30.

The electrostatic chuck 20 is a disc-shaped AlN plate having an outer diameter smaller than the outer diameter of the wafer W and includes an electrostatic electrode 22 and a heater electrode 24. The electrostatic electrode 22 is a planar electrode to which a direct-current voltage can be applied from an external power supply (not shown) through a rod-like power supply terminal 23. When a direct-current voltage is applied to the electrostatic electrode 22, the wafer W is adsorbed and fixed to a wafer mounting face 20a by the action of Johnson-Rahbeck force. When the application of the direct-current voltage is terminated, the wafer w is released from the wafer mounting face 20a. The heater electrode 24 has a pattern, for example, of a single continuous line so as to realize electric wiring over the entire surface of the electrostatic chuck 20. Upon, the application of a voltage, the heater electrode 24 generates heat and heats the wafer W. A voltage can be applied to the heater electrode 24 via a rod-like power supply terminal 25 extending from the back side of the cooling plate 30 to one end and the other end of the heater electrode 24.

The cooling plate 30 is a disc-shaped plate having an outer diameter slightly greater than or equal to the outer diameter of the electrostatic chuck 20 and includes a first substrate 31, a second substrate 32, a third substrate 33, a first metal bonding layer 34 disposed between the first substrate 31 and the second substrate 32, a second metal bonding layer 35 disposed between, the second substrate 32 and the third substrate 33, and a refrigerant path 36 through which a refrigerant can flow. The first to third substrates 31, 32, and 33 are formed of a dense composite material. The dense composite material contains the following three compounds with the highest contents: silicon carbide, titanium silicon carbide, and titanium carbide, in descending order of their contents. The silicon carbide content ranges from 51 to 68 mass %. The dense composite material contains no titanium silicide. The open porosity of the dense composite material is 1% or less. The dense composite material will be described in detail later. The second substrate 32 includes a punched portion 32a. The punched portion 32a is formed by punching the second substrate 32 from one surface to the other surface of the second substrate 32 such that the punched portion 32a has the same shape as the refrigerant path 36. The first and second metal bonding layers 34 and 35 are formed by thermal compression bonding of the substrates 31 to 33 with an Al—Si—Mg metal bonding material interposed between the first substrate 31 and one surface of the second substrate 32 and between the other surface of the second substrate 32 and the third substrate 33. The cooling plate 30 includes a refrigerant supply hole 46a and a refrigerant discharge hole 46b, which extend in a direction perpendicular to the wafer mounting face 20a from a surface opposite a surface to which the electrostatic chuck 20 is bonded. The refrigerant supply hole 46a and a refrigerant discharge hole 46b are connected to an inlet 36a and an outlet 36b, respectively, of the refrigerant path 36. The cooling plate 30 includes terminal insertion, holes 43 and 45 passing through a surface to which the electrostatic chuck 20 is bonded and its opposite surface. The terminal insertion hole 43 is a hole into which the power supply terminal 23 of the electrostatic electrode 22 is inserted. The terminal insertion hole 45 is a hole into which the power supply terminal 25 of the heater electrode 24 is inserted.

The cooling plate-chuck bonding layer 40 is formed by thermal compression bonding of the first substrate 31 of the cooling plate 30 and the electrostatic chuck 20 with an Al—Si—Mg or Al—Mg metal bonding material interposed therebetween. The power supply terminals 23 and 25 are not in direct contact with the cooling plate 30, the first and second metal bonding layers 34 and 35, and the cooling plate-chuck bonding layer 40.

The member 10 for a semiconductor manufacturing apparatus may include a gas supply hole for supplying He gas to the back side of the wafer W and a lift pin insertion hole into which a lift pin for lifting the wafer W from the wafer mounting face 20a is inserted. The gas supply hole and the lift pin insertion hole pass through the member 10 for a semiconductor manufacturing apparatus in a direction perpendicular to the wafer mounting face 20a.

A usage example of the member 10 for a semiconductor manufacturing apparatus will be described below. First, a wafer W is placed on. the wafer mounting face 20a of the member 10 for a semiconductor manufacturing apparatus in a. vacuum chamber (not-shown). The internal pressure of the vacuum chamber is then reduced with a vacuum pump to a predetermined degree of vacuum. A direct-current voltage is applied to the electrostatic electrode 22 to generate a Johnson-Rahbeck force, thereby adsorbing and. fixing the wafer W to the wafer mounting face 20a. The vacuum chamber is then filled with a reactant gas at a predetermined pressure (for example, tens to hundreds of pascals), and a plasma, is formed in the vacuum chamber. A surface of the wafer W is etched with the plasma. The electric power supplied to the heater electrode 24 is controlled with a controller (not shown) such that the wafer W has a target temperature.

Figure 3:
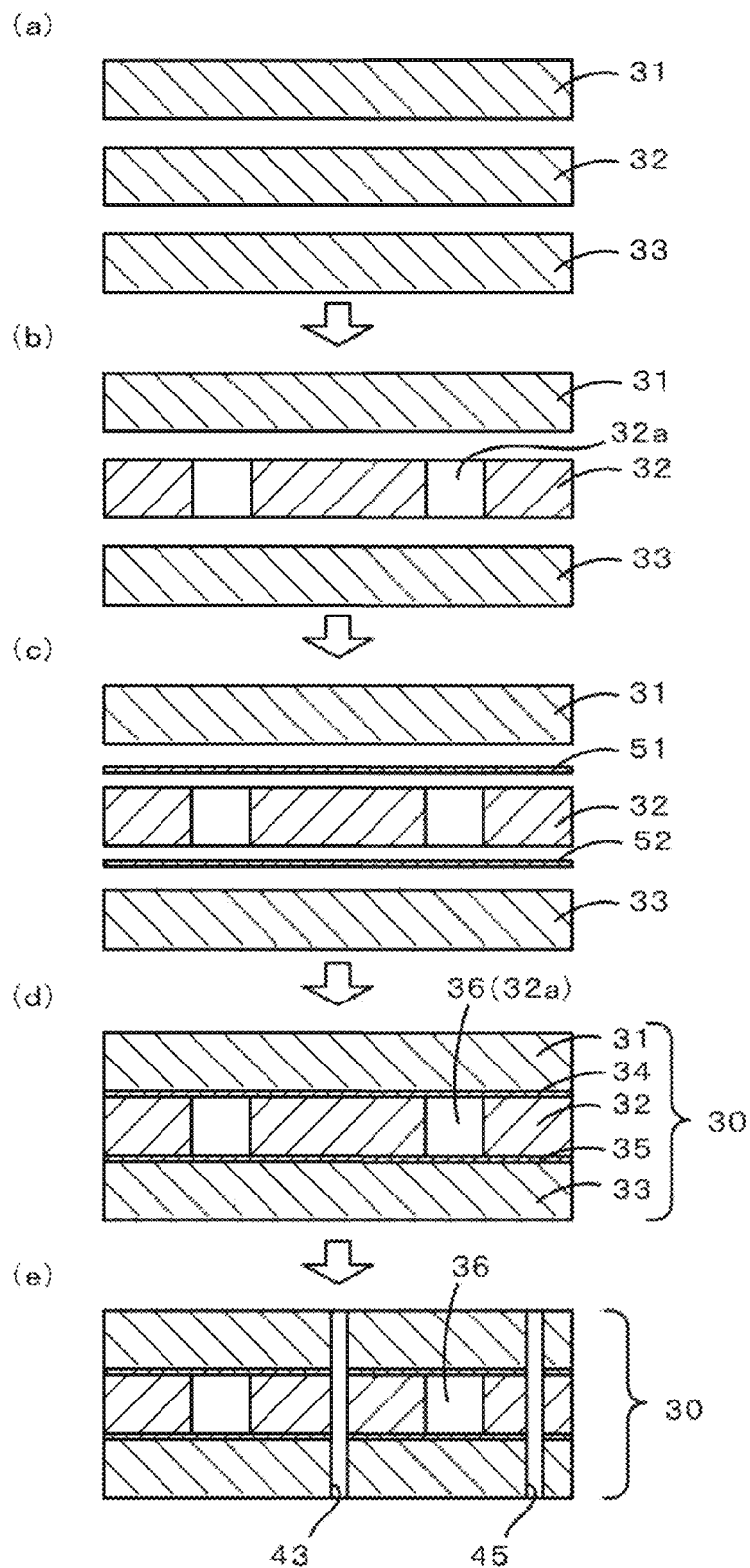
FIG. 3 includes manufacturing process drawings of the member 10 for a semiconductor manufacturing apparatus.
Figure 4:
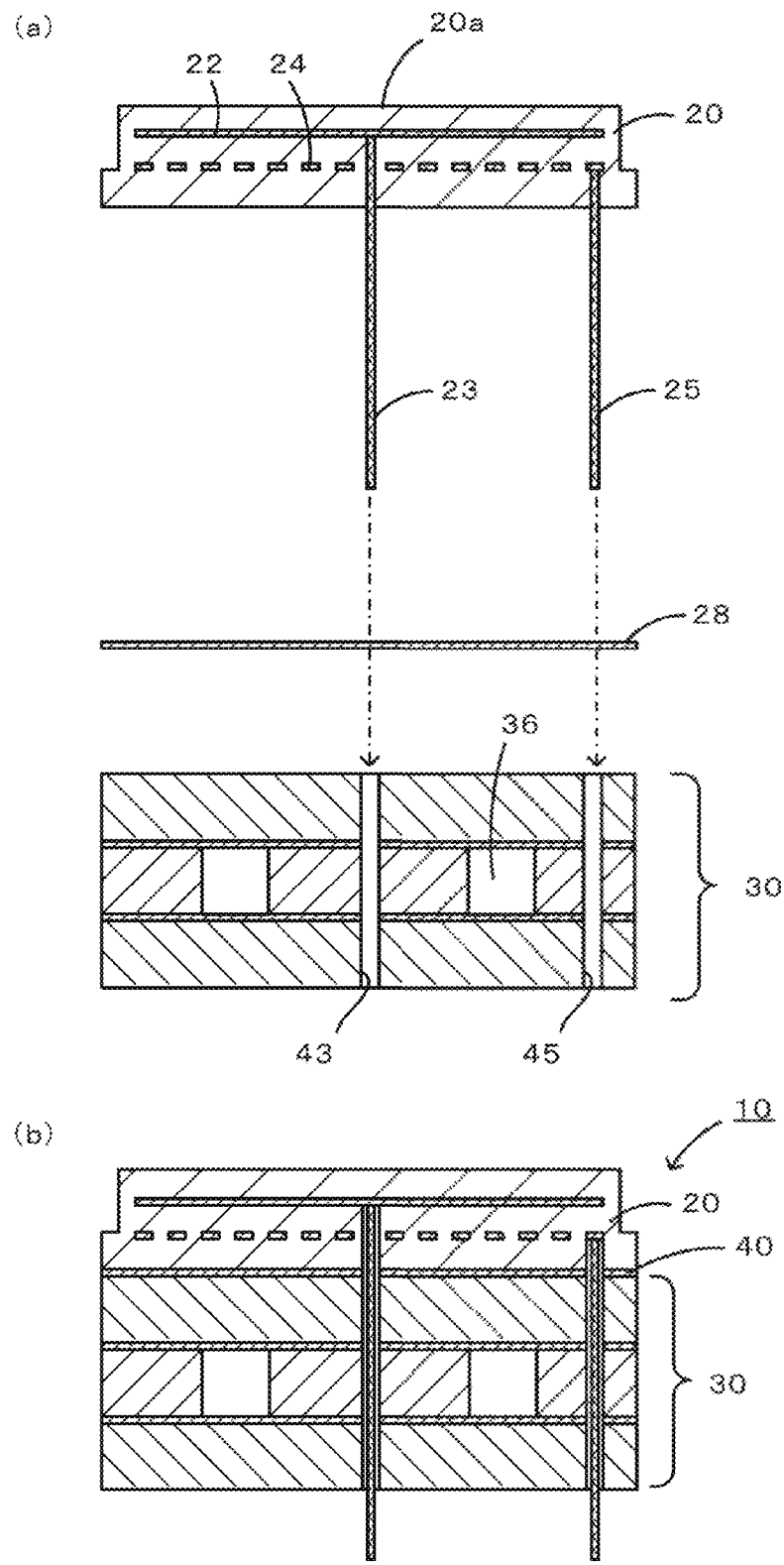
FIG. 4 includes manufacturing process drawings of the member 10 for a semiconductor manufacturing apparatus.
Figure 5:
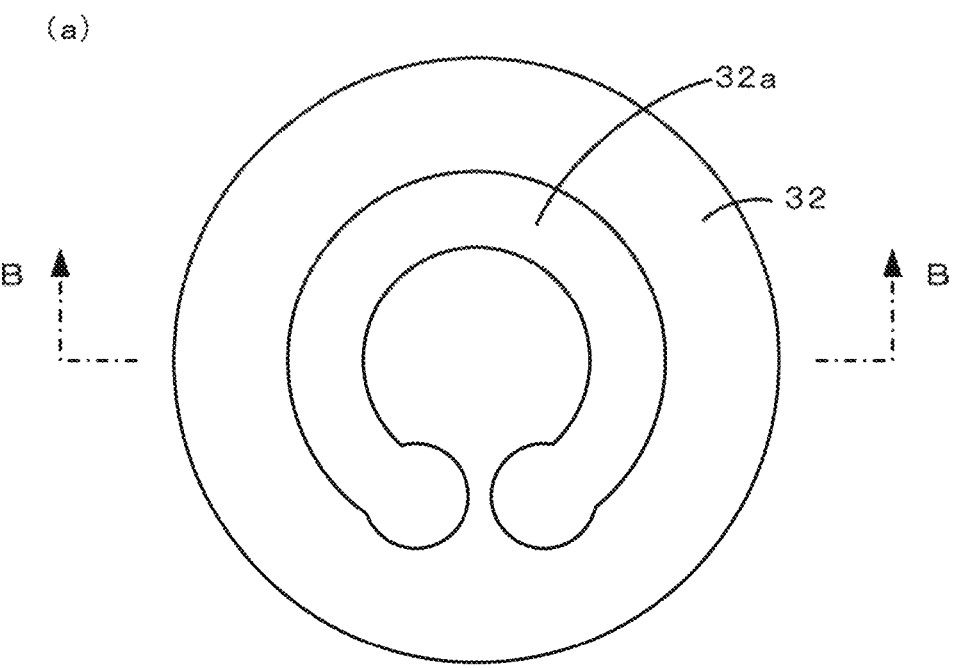
FIG. 5 includes explanatory views of a second substrate 32.
Figure 5:
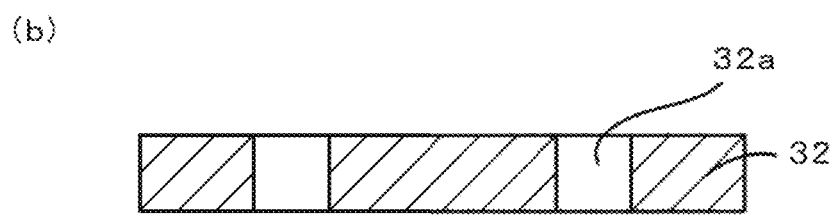

A manufacturing example of the member 10 for a semiconductor manufacturing apparatus will be described below. FIGS. 3 and 4 are manufacturing process drawings of the member 10 for a semiconductor manufacturing apparatus. FIG. 5 includes explanatory views of the second substrate 32. FIG. 5(a) is a plan view, and FIG. 5(b) is a cross-sectional view taken along the line B-B of FIG. 5(a).

First, the first to third substrates 31 to 33 in the form of a disc-shaped thin plate are formed using the dense composite material (see FIG. 3(a)). The punched portion 32a is then formed in the second substrate 32 by punching the second substrate 32 from one surface to the other surface of the second substrate 32 such that the punched portion 32a has the same shape as the refrigerant path 36 (see FIG. 3(b) and FIG. 5). The punched portion 32a can be formed using a machining center, water jet, or electrical discharge machining. The first to third substrates 31 and 32 are then subjected to thermal compression bonding (see FIG. 3(d)) with a metal bonding material 51 interposed between the first substrate 31 and one surface of the second substrate 32 and a metal bonding material 52 interposed between the other surface of the second substrate 32 and the third substrate 33 (see FIG. 3(c)). In this way, the punched portion 32a becomes the refrigerant path 36, the first metal bonding layer 34 is formed between the first substrate 31 and the second substrate 32, and the second metal bonding layer 35 is formed between the second substrate 32 and the third substrate 33. Thus, the cooling plate 30 is completed. Each of the metal bonding materials 51 and 52 is preferably a Al—Si—Mg or Al—Mg bonding material. The thermal compression bonding (TCB) using these bonding materials is performed by pressing the substrates at a pressure in the range of 0.5 to 2.0 kg/mm2 for 1 to 5 hours in a vacuum atmosphere at a temperature less than or equal to the solidus temperature. The refrigerant supply hole 46a and the refrigerant discharge hole 46b are then formed. The refrigerant supply hole 46a extends from the back side of the cooling plate 30 to the inlet 36a of the refrigerant path 36. The refrigerant discharge hole 46b extends from the back side of the cooling plate 30 to the outlet 36b of the refrigerant path 36. The terminal insertion holes 43 and 45 passing through the front and back sides of the cooling plate 30 are also formed (see FIG. 3(e); the inlet 36a and the outlet 36b of the refrigerant path 36, the refrigerant supply hole 46a, and the refrigerant discharge hole 46b are not shown in FIG. 3(e) but shown in FIG. 1).

The electrostatic chuck 20 is separately manufactured. The electrostatic chuck 20 includes the electrostatic electrode 22 and the heater electrode 24 buried therein and. the power supply terminals 23 and 25 (see FIG. 4(a)). The electrostatic chuck 20 can be prepared as described in Japanese Unexamined Patent Application Publication No. 2006-196864. The electrostatic chuck 20 and the cooling plate 30 are subjected to thermal compression bonding with a metal bonding material 28 interposed between a surface opposite the wafer mounting face 20a of the electrostatic chuck 20 and a surface of the first substrate 31 of the cooling plate 30 while the power supply terminals 23 and 25 are inserted into the terminal insertion holes 43 and 45 (see FIG. 4(a). As a result, the cooling plate-chuck bonding layer 40 is formed between the electrostatic chuck 20 and the cooling plate 30, thus completing the member 10 for a semiconductor manufacturing apparatus (see FIG. 4(b)).

Preferably, TCB is performed using an Al—Si—Mg or Al—Mg bonding material as the metal bonding material 28, as described above.

In the cooling plate 30 according to the first embodiment described in detail, the first to third substrates 31 to 33 bonded together using the first and second metal bonding layers 34 and 35 are formed of the dense composite material. The dense composite material has a very small difference in linear thermal expansion coefficient from AlN and has sufficiently high thermal conductivity, denseness, and strength. Thus, the member 10 for a semiconductor manufacturing apparatus manufactured by bonding the cooling plate 30 to the electrostatic chuck 20, which is an AIM ceramic member, has a long life while maintaining high heat dissipation performance without separation between the cooling plate 30 and the electrostatic chuck 20 even when the member is repeatedly used between low temperatures and high temperatures. The first to third substrates 31 to 33 formed of the dense composite material are difficult to bond together by electron-beam welding. The first to third substrates 31 to 33 bonded together using a resin binder have low cooling performance. In the present invention, however, the first to third substrates 31 to 33 can be relatively easily bonded together by TCB using a metal bonding material and have high cooling performance.

The first to third substrates 31 to 33 have sufficiently high denseness and allow a coolant liquid or gas to pass through the cooling plate 30, thereby further improving cooling efficiency. Because of their sufficiently high strength, the first to third substrates 31 to 33 can withstand processing or bonding in the manufacture of the member 10 for a semiconductor manufacturing apparatus and can sufficiently withstand stress resulting from a temperature change during use.

[Member for Semiconductor Manufacturing Apparatus—Second Embodiment]

Figure 6:
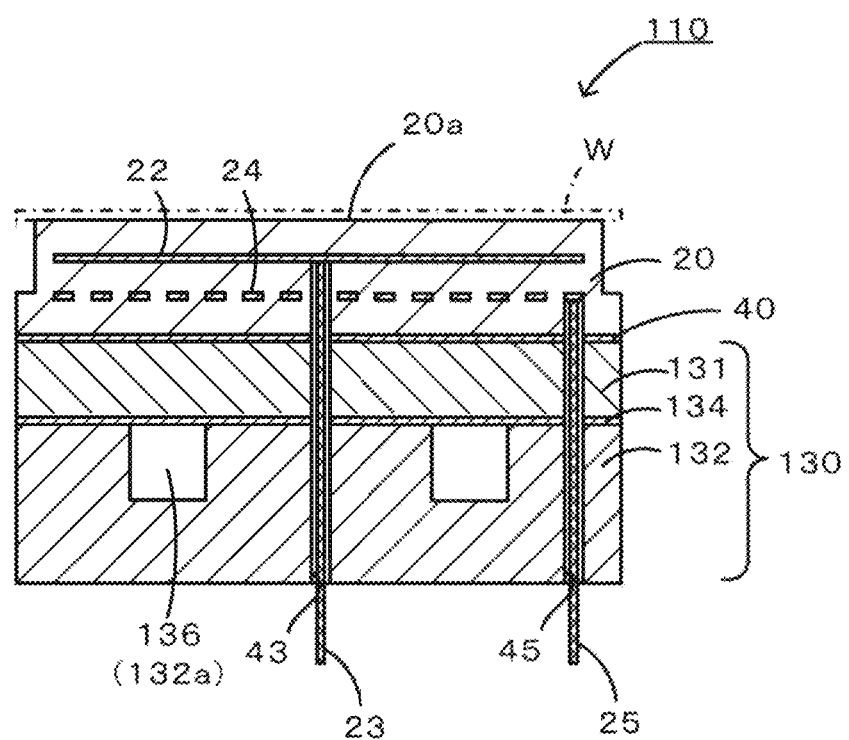
FIG. 6 is a cross-sectional view of a member 110 for a semiconductor manufacturing apparatus.

A member 110 for a semiconductor manufacturing apparatus according to a second embodiment will be described below. FIG. 6 is a cross-sectional view of the member 110 for a semiconductor manufacturing apparatus.

The member 110 for a semiconductor manufacturing apparatus includes an AIM electrostatic chuck 20 for adsorbing a silicon wafer W to be subjected to plasma, processing, a cooling plate 130 formed of a dense composite material having substantially the same linear thermal expansion coefficient as AlN, and a cooling plate-chuck bonding layer 40 for bonding between the cooling plate 130 and the electrostatic chuck 20.

The electrostatic chuck 20 is the same as in the first embodiment, has the same reference numerals as in the first embodiment, and will not be further described. The cooling plate 130 is a disc-shaped plate having an outer diameter slightly greater than, or equal to the outer diameter of the electrostatic chuck 20 and includes a first substrate 131, a second substrate 132, a metal bonding layer 134 disposed between the first substrate 131 and the second substrate 132, and a refrigerant path 136 through which a refrigerant can flow. The first and second substrates 131 and 132 are formed of the same material as the dense composite material used in the first embodiment. The second substrate 132 has a groove for the refrigerant path 136 in a surface thereof opposite the first substrate 131. The metal bonding layer 134 is formed by thermal compression bonding of the first substrate 131 and the second substrate 132 with an Al—Si—Mg or Al—Mg metal bonding material interposed between the first substrate 131 and a surface of the second substrate 132 in which a groove 132a is disposed. As in the first embodiment, the cooling plate 130 includes a refrigerant supply hole (not shown) and a refrigerant discharge hole (not shown) connected to an inlet and an outlet, respectively, of the refrigerant path 136. As in the first embodiment, the cooling plate 130 includes terminal insertion holes 43 and 45. The cooling plate-chuck bonding layer 40 is the same as in the first embodiment and will not be described.

A usage example of the member 110 for a semiconductor manufacturing apparatus is the same as in the first embodiment and will not be described.

Figure 7:
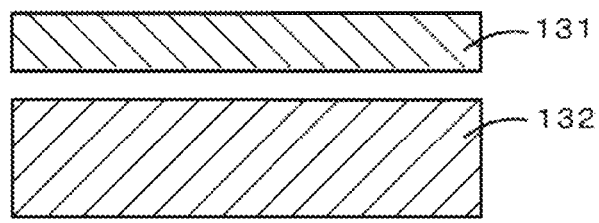
FIG. 7 includes manufacturing process drawings of the member 110 for a semiconductor manufacturing apparatus.
Figure 7:
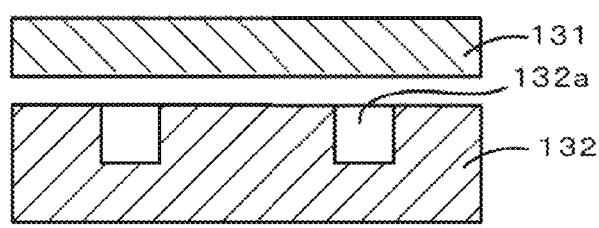
Figure 7:
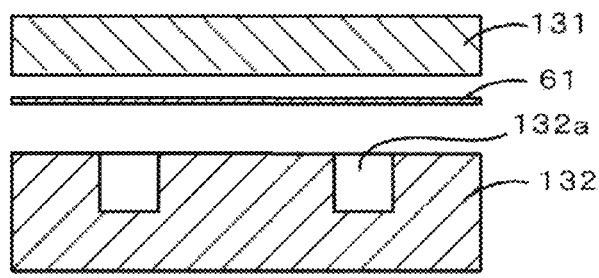
Figure 7:
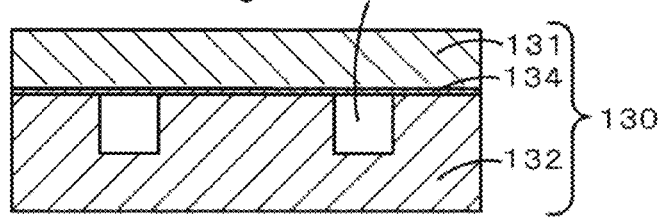
Figure 7:
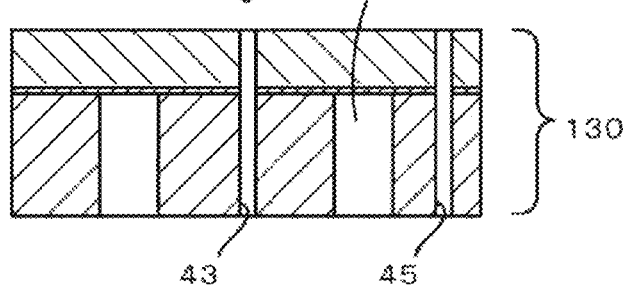
Figure 8:
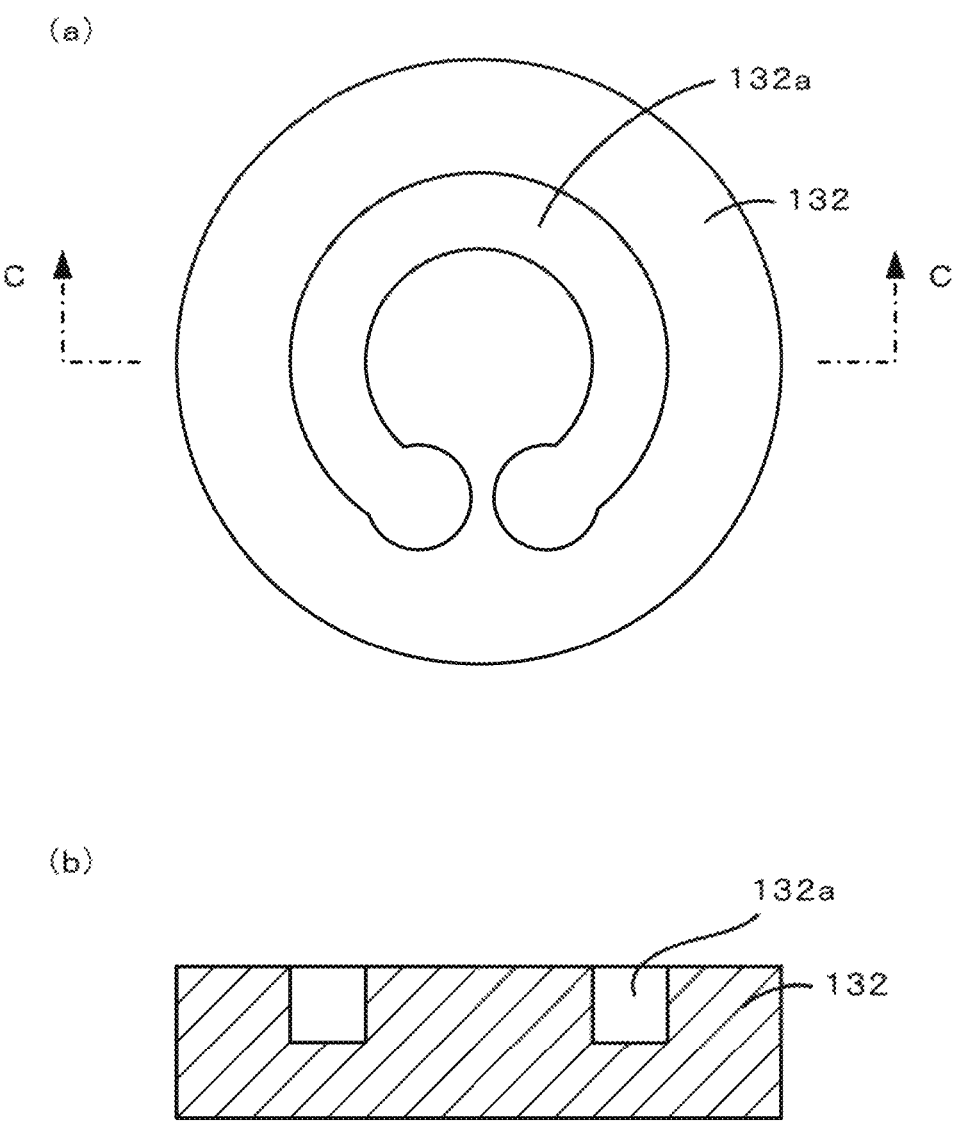
FIG. 8 includes explanatory views of a second substrate 132.

A manufacturing example of the member 110 for a semiconductor manufacturing apparatus will be described below. FIG. 7 includes manufacturing process drawings of the member 110 for a semiconductor manufacturing apparatus. FIG. 8 includes explanatory views of the second substrate 132. FIG. 8(a) is a plan view, and FIG. 8(b) is a cross-sectional view taken along the line C-C of FIG. 8(a). First, the first and second substrates 131 and 132 in the form of a disc-shaped thin plate are formed using the dense composite material (see FIG. 7(a)). The groove 132a for the refrigerant path 36 is then formed in a surface of the second substrate 132 opposite the first substrate 131 (see FIG. 7(b) and FIG. 8). The groove 132a can be formed using a machining center, water jet, or electrical discharge machining. The first and second substrates 131 and 132 are then subjected to thermal compression bonding (see FIG. 7(d)) with a metal bonding material 61 interposed between the first substrate 131 and a surface of the second substrate 132 in which the groove 132a is formed (see FIG. 7(c)). In. this way, the groove 132a becomes the refrigerant path 136, and the metal bonding layer 134 is formed between the first substrate 131 and the second substrate 132. Thus, the cooling plate 130 is completed. Preferably, TCB is performed using an Al—Si—Mg or Al—Mg bonding material as the metal bonding material 61, as described above. The subsequent process, that is, a process of bonding between the electrostatic chuck 20 and the cooling plate 130 is the same as in the first embodiment and will not be further described.

In the cooling plate 130 according to the second embodiment described in detail, the first and second substrates 131 and 132 bonded together using the metal bonding layer 134 are formed of the dense composite material. The dense composite material has a very small difference in linear thermal expansion coefficient from AlN and has sufficiently high thermal conductivity, denseness, and strength. Thus, the member 110 for a semiconductor manufacturing apparatus manufactured by bonding the cooling plate 130 to the electrostatic chuck 20, which is an AlN ceramic member, has a long life while maintaining high heat dissipation performance without separation between the cooling plate 130 and the electrostatic chuck 20 even when the member is repeatedly used between low temperatures and high temperatures. The first and second substrates 131 and 132 formed of the dense composite material are difficult to bond together by electron-beam welding. The first and second substrates 131 and 132 bonded together using a resin binder have low cooling performance. In the present invention, however, the first and second substrates 131 and 132 can be relatively easily bonded together by TCB using a metal bonding material and have high cooling performance.

The first and second substrates 131 and 132 have sufficiently high denseness and allow a coolant liquid or gas to pass through the cooling plate 130, thereby further improving cooling efficiency. Because of their sufficiently high strength, the first and second substrates 131 and 132 can withstand processing or bonding in the manufacture of the member 110 for a semiconductor manufacturing apparatus and can sufficiently withstand stress resulting from a temperature change during use.

[Dense Composite Material]

The dense composite material used in the embodiments described above contains the following three compounds with the highest contents: silicon carbide, titanium silicon carbide, and titanium carbide, in descending order of their contents. The silicon carbide content ranges from 51 to 68 mass %. The dense composite material contains no titanium silicide. The open porosity of the dense composite material is 1% or less. The content is determined on the basis of X-ray diffraction peaks. The open porosity is measured in accordance with Archimedes' principle using pure water as a medium.

The silicon, carbide content ranges from 51 to 68 mass %. A silicon carbide content of less than 51 mass % is unfavorable because of a large difference in thermal .expansion coefficient from aluminum nitride. A silicon carbide content of more than 68 mass % is unfavorable because of a high open porosity or insufficient strength.

The titanium silicon carbide content is lower than the silicon carbide content, and the titanium carbide content is lower than the titanium silicon carbide content. The titanium silicon carbide is preferably $Ti_3SiC_2$ (TSC). The titanium carbide is preferably Tic For example, the titanium silicon carbide content preferably ranges from 27 to 40 mass %, and the titanium carbide content preferably ranges from 4 to 12 mass %.

Preferably, at least one of the titanium silicon carbide and the titanium carbide is disposed between the silicon carbide particles and covers the surface of the silicon carbide particles. In densely dispersed silicon carbide particles, pores tend to remain between the silicon carbide particles. However, as described above, when silicon carbide particles are covered with other particles, pores can be easily filled. Thus, the dense composite material can have higher density and strength.

The dense composite material used in these embodiments has substantially the same linear thermal expansion coefficient as aluminum nitride. Thus, a member formed of the dense composite material bonded to a member formed of aluminum nitride (for example, by metal bonding) rarely separates even when repeatedly used between low temperatures and high temperatures. More specifically, the difference in average linear thermal expansion coefficient between the dense composite material and aluminum nitride is preferably 0.5 ppm/K or less at a temperature in the range of ° C. to 570° C. More preferably, the average linear thermal expansion coefficient of the dense composite material preferably ranges from 5.4 to 6.0 ppm/K at a temperature in the range of 40° C. to 570° C. The average linear thermal expansion coefficient of an aluminum nitride sintered body in which 5% by weight $Y_2O_3$ as a sintering aid was added to aluminum nitride was 5.7 ppm/K when measured at a temperature in the range of 40° C. to 50° C. under the same conditions as in the case of the dense composite material. The average linear thermal expansion coefficient of the aluminum nitride sintered body without the sintering aid was 5.2 ppm/K. Thus, the present invention aims to provide an aluminum nitride sintered body having a linear thermal expansion coefficient of 5.5 ppm/K (40° C. to 570° C.) as a central value between these values and having a difference in average linear thermal expansion coefficient of 0.5 ppm/K or less.

The dense composite material used in the embodiments has high thermal conductivity and preferably has a thermal conductivity of 100 W/m·K. or more. A member formed of the dense composite material bonded to a member formed of aluminum nitride by metal bonding can efficiently dissipate heat from the aluminum nitride.

The dense composite material used in the embodiments has high strength and preferably has a four-point bending strength of 300 MPa or more. A member formed of the dense composite material can be easily applied to cooling plates.

A method for producing the dense composite material used in the embodiments may include (a) preparing a powder mixture that contains 43 to 52 mass % silicon carbide, 33 to 4.5 mass % titanium carbide, and the remainder including 18 mass % or less titanium silicide and/or 13 mass % or less silicon and (b) sintering the powder mixture by hot pressing in an inert atmosphere to produce the dense composite material.

In the step (a), the particle size of the silicon carbide raw powder is not particularly limited, and the silicon carbide raw powder preferably has an average particle size in the range of 2 to 35 μm. Coarse particles (for example, an average particle size in the range of 15 to 35 μm) may be used alone, or fine particles (for example, an average particle size in the range of 2 to 10 μm) may be used alone, or coarse particles and fine particles may be used in combination. When SiC has an average particle size of less than 2 μm, a composition, having a high, percentage of SiC in the raw materials has low sinterability because of a large surface area of the SiC particles. Thus, it is difficult to form a dense sintered body. When SiC has an average particle size of more than 35 μm, this may result in low strength, although there is no problem in terms of sinterability. In the step (a), as described above, although silicon carbide, titanium, carbide, and titanium silicide may foe used as raw powders, raw powders may also be appropriately selected from silicon carbide, titanium carbide, titanium silicide, titanium, and silicon.

In the step (b), the inert atmosphere may be a vacuum atmosphere, a nitrogen gas atmosphere, or an argon gas atmosphere, The hot pressing conditions may be determined such that the dense composite material can be produced. For example, the hot pressing pressure preferably ranges from 100 to 400 kgf/cm², more preferably 200 to 300 kgf/cm². The hot pressing temperature preferably ranges from 1550° C. to 1800° C., more preferably 1600° C. to 1750° C. The relationship between the pressure and the temperature may be established in these ranges in a manner that depends on the composition of the powder mixture and the particle sizes of the raw material powders. For example, in the case of a low silicon carbide content of the powder mixture, densification is performed under relatively mild hot pressing conditions because of high sinter ability of the powder mixture. On the other hand, in the case of a high silicon carbide content of the powder mixture, densification is performed under relatively severe hot pressing conditions because of low sinterability of the powder mixture. In the case where coarse silicon carbide particles are used alone, densification is performed under relatively severe hot pressing conditions. In the case where coarse particles and fine particles are used in combination, densification is performed under relatively mild hot pressing conditions. The firing time depends on the hot pressing conditions and may range from 1 to 10 hours. Use of coarse particles and fine particles in combination is preferred to use of coarse particles alone because a mixture of coarse particles and fine particles tends to be densified under mild hot pressing conditions.

When the silicon carbide content of the powder mixture is 43 mass % or more and less than 47 mass %, the hot pressing conditions in the step (b) preferably include 1600° C. to 1800° C. and 200 to 400 kgf/cm², regardless of whether silicon carbide is in the form of coarse particles or fine particles. When the silicon carbide content, of the powder mixture is 47 mass % or more and 52 mass % or less, the hot pressing conditions preferably include 1650° C. to 1800° C. and 300 to 400 kgf/cm² or 1750° C. to 1800° C. and 250 to 400 kgf/cm², regardless of whether silicon carbide is in the form of coarse particles or fine particles. When silicon carbide is in the form of mixed particles of coarse particles and fine particles, the hot pressing conditions preferably include 1650° C. to 1800° C. and 300 to 400 kgf/cm² or 1700° C. to 1800° C. and 250 to 400 kgf/cm².

EXAMPLES

[Member for Semiconductor Manufacturing Apparatus]

An electrostatic chuck 20 of a member 10 for a semiconductor manufacturing apparatus according to an example was made of AlN, was of Johnson-Rahbek type, had a diameter of 297 mm, a thickness of 5 mm, and a dielectric film thickness (a thickness from an electrostatic electrode 22 to a wafer mounting face 20a) of 0.35 mm, and included a heater electrode 24 formed of a Nb coil. A cooling plate 30 was manufactured by TCB of first to third substrates 31 to 33 formed of a dense material described below in an experimental example 15 using an Al—Si—Mg bonding material (containing 88.5% by weight Al, 10% by weight Si, and 1.5% by weight Mg and having a solidus temperature of approximately 560° C.). In the TCB, the substrates were pressurized at a pressure of 1.5 kg/mm² in a vacuum atmosphere at a temperature in the range of 540° C. to 560° C. for 5 hours. The cooling plate 30 had a diameter of 340 mm and a thickness of 32 mm. The electrostatic chuck 20 and the cooling plate 30 were bonded together by TCB using the same bonding material. A cooling plate-chuck bonding layer 40 had a thickness of 0.12 mm. A member for a semiconductor manufacturing apparatus according to a comparative example was manufactured in the same manner as in the example except that the cooling plate was manufactured by bonding first to third aluminum substrates using an acrylic resin (having a thermal conductivity of 0.2 W/mK).

While pure water (a refrigerant) having a temperature of 25° C. was flown through a refrigerant path 36 in the cooling plate 30 of the member 10 for a semiconductor manufacturing apparatus according to the example at a flow rate of 13 L/min, a predetermined electric power was supplied to the heater electrode 24 to generate heat. The temperature of the wafer mounting face 20a was monitored with a surface thermometer. The member for a semiconductor manufacturing apparatus according to the comparative example was monitored in the same manner. Table 1 shows the results. Table 1 shows that the example exhibited better cooling performance than the comparative example for any electric power.

TABLE 1

| Electric Power Supplied | Temperature of Wafer Mounting Face (° C.) | |
|---|---|---|
| (W) | Comparative Example | Example |
| 2000 | 30 | 7 |
| 4000 | 65 | 15 |
| 6000 | 100 | 20 |

[Dense Composite Material]

A suitable application of the dense composite material used in the embodiments will be described, below. A commercial product having a purity of 96.0% or more and an average particle size of 32.3, 16.4, or 2.9 μm was used as a SiC raw material. A commercial product having a purity of 94.5% or more and an average particle size of 4.3 um was used as a Tic raw material, A commercial product having a purity of 96.0% or more and an average particle size of 6.9 μm was used as a TiSi₂ raw material. A commercial product having a purity of 97.0% or more and an average particle size of 2.1 μm was used as a Si raw material.

1. Production Procedures

Preparation

The SiC raw material, the Tic raw material, and the TiSi₂ raw material, or the SiC raw material, the TiC raw material, and the Si raw material were weighed at the mass percentages listed in Tables 2 and 3 and were wet-blended in an isopropyl alcohol solvent in a nylon pot using iron-core nylon balls having a diameter of 10 mm for 4 hours. After blending, the resulting slurry was taken out and was dried in a nitrogen stream at 110° C. The dried product was passed through a 30-mesh sieve to yield a blended powder. It was confirmed that mixing approximately 300 g of the weighed raw materials in a high-speed fluidizing mixer (the capacity of a powder charging unit was 1.8 L) while impeller blades were rotated at 1500 rpm resulted in the same material properties as the wet blending.

Molding

The blended powder was uniaxially pressed at a pressure of 200 kgf/cm² to form a disc-shaped compact having a diameter of 50 mm. and a thickness of approximately 15 mm. The disc-shaped compact was placed in a graphite mold for firing.

Firing

The disc-shaped compact was subjected to hot-press firing to produce a dense sintered material. The hot-press firing was performed at a firing temperature (maximum temperature) and at a pressing pressure listed in Tables 2 and 3 in a vacuum atmosphere. The vacuum atmosphere was maintained, to the completion of firing. The holding time at the firing temperature was 4 hours. Hot pressing is hereinafter abbreviated to HP.

2. Experimental Examples

Tables 2 and 3 show the starting material composition (mass %) of each experimental example, the particle size and percentage of the SiC raw material, HP firing conditions, the constituent, phases of a sintered body and their ratio determined from XRD measurement results (results of simple determination), and the baseline characteristics of the sintered body (the open porosity, bulk density, four-point bending strength, linear thermal expansion coefficient, and thermal conductivity). Among experimental examples 1 to 36, the experimental examples 3 to 7, 10, 12, 13, 15, 16, 18 to 21, 23, 24, 26, and 33 to 36 are dense composite materials suitable for use in the embodiments, and the remainder are unsuitable materials.

TABLE 2

| Experimental Example Nos. ○: Suitable X: Unsuitable | Starting Material Composition (mass %) | | | | | Percentage of SiC Raw Material | | | HP Firing Conditions | |
|---|---|---|---|---|---|---|---|---|---|---|
| | SiC | TiC | TiSi$_2$ | Si | Total | Percentage of 32.3 μm | Percentage of 16.4 μm | Percentage of 2.9 μm | Firing Temperature (° C.) | Pressing Pressure (Kg/cm$^2$) |
| No. 1 (X)  | 41.2 | 41.0 | 17.8 | — | 100 | 0  | 100 | 0   | 1700 | 200 |
| No. 2 (X)  | 41.2 | 41.0 | 17.8 | — | 100 | 0  | 0   | 100 | 1700 | 200 |
| No. 3 (○)  | 43.1 | 39.6 | 17.2 | — | 100 | 0  | 100 | 0   | 1600 | 200 |
| No. 4 (○)  | 43.1 | 39.6 | 17.2 | — | 100 | 0  | 100 | 0   | 1650 | 200 |
| No. 5 (○)  | 43.1 | 39.6 | 17.2 | — | 100 | 0  | 100 | 0   | 1700 | 200 |
| No. 6 (○)  | 43.1 | 39.6 | 17.2 | — | 100 | 0  | 0   | 100 | 1700 | 200 |
| No. 7 (○)  | 49.2 | 35.3 | 15.5 | — | 100 | 0  | 100 | 0   | 1650 | 300 |
| No. 8 (X)  | 49.2 | 35.3 | 15.5 | — | 100 | 0  | 100 | 0   | 1700 | 200 |
| No. 9 (X)  | 49.2 | 35.3 | 15.5 | — | 100 | 0  | 100 | 0   | 1700 | 250 |
| No. 10 (○) | 49.2 | 35.3 | 15.5 | — | 100 | 0  | 100 | 0   | 1700 | 300 |
| No. 11 (X) | 49.2 | 35.3 | 15.5 | — | 100 | 0  | 100 | 0   | 1750 | 200 |
| No. 12 (○) | 49.2 | 35.3 | 15.5 | — | 100 | 0  | 100 | 0   | 1750 | 250 |
| No. 13 (○) | 49.2 | 35.3 | 15.5 | — | 100 | 0  | 65  | 35  | 1650 | 300 |
| No. 14 (X) | 49.2 | 35.3 | 15.5 | — | 100 | 0  | 65  | 35  | 1700 | 200 |
| No. 15 (○) | 49.2 | 35.3 | 15.5 | — | 100 | 0  | 65  | 35  | 1700 | 250 |
| No. 16 (○) | 49.2 | 35.3 | 15.5 | — | 100 | 0  | 65  | 35  | 1700 | 300 |
| No. 17 (X) | 49.2 | 35.3 | 15.5 | — | 100 | 0  | 65  | 35  | 1725 | 200 |
| No. 18 (○) | 49.2 | 35.3 | 15.5 | — | 100 | 0  | 65  | 35  | 1750 | 250 |
| No. 19 (○) | 49.2 | 35.3 | 15.5 | — | 100 | 65 | 0   | 35  | 1725 | 200 |
| No. 20 (○) | 49.2 | 35.3 | 15.5 | — | 100 | 55 | 0   | 45  | 1725 | 200 |

| Experimental Example Nos. ○: Suitable X: Unsuitable | Constituent Phase based on XRD (mass %) | | | | | Baseline Characteristics of Sintered Body | | | | |
|---|---|---|---|---|---|---|---|---|---|---|
| | SiC | TSC | TiC | TiSi$_2$ | Total | Open Porosity (%) | Bulk Density (g/cm$^2$) | 4-Point Bending Strength (MPa) | Linear Thermal Expansion Coefficient (ppm/K) | Thermal Conductivity (W/mK) |
| No. 1 (X)  | 50.1 | 41.9 | 8    | —*1 | 100 | 0.0 | 3.80 | 359 | 6.2 | 102 |
| No. 2 (X)  | 47.9 | 40.5 | 11.8 | —   | 100 | 0.0 | 3.80 | 370 | 6.1 | 98  |
| No. 3 (○)  | 51.1 | 39.3 | 9.6  | —   | 100 | 0.0 | 3.75 | 368 | 6.0 | 105 |
| No. 4 (○)  | 52.8 | 36.1 | 11.1 | —   | 100 | 0.0 | 3.74 | 371 | 6.0 | 104 |
| No. 5 (○)  | 51.5 | 39.1 | 9.4  | —   | 100 | 0.0 | 3.74 | 350 | 5.9 | 107 |
| No. 6 (○)  | 52.9 | 38.1 | 9    | —   | 100 | 0.0 | 3.75 | 375 | 6.0 | 102 |
| No. 7 (○)  | 63.5 | 29.2 | 7.3  | —   | 100 | 0.9 | 3.55 | 310 | 5.8 | 120 |
| No. 8 (X)  | 64.1 | 29.8 | 6.1  | —   | 100 | 7.0 | 3.34 | 199 | 5.8 | 110 |
| No. 9 (X)  | 63.7 | 30.1 | 6.2  | —   | 100 | 1.9 | 3.52 | 313 | 5.8 | 115 |
| No. 10 (○) | 63.4 | 30.4 | 6.2  | —   | 100 | 0.2 | 3.58 | 345 | 5.8 | 123 |
| No. 11 (X) | 60.6 | 31.5 | 7.9  | —   | 100 | 6.8 | 3.35 | 205 | 5.8 | 109 |
| No. 12 (○) | 59.4 | 33.1 | 7.5  | —   | 100 | 0.0 | 3.72 | 375 | 5.8 | 119 |
| No. 13 (○) | 62.9 | 29.1 | 8.0  | —   | 100 | 0.9 | 3.62 | 330 | 5.8 | 121 |
| No. 14 (X) | 64.3 | 29.3 | 6.4  | —   | 100 | 6.0 | 3.47 | 279 | 5.7 | 115 |
| No. 15 (○) | 65.4 | 29.6 | 5    | —   | 100 | 0.4 | 3.59 | 364 | 5.7 | 123 |
| No. 16 (○) | 65.2 | 29.4 | 5.4  | —   | 100 | 0.0 | 3.68 | 417 | 5.7 | 125 |
| No. 17 (X) | 62.3 | 31.9 | 5.8  | —   | 100 | 1.7 | 3.68 | 311 | 5.8 | 117 |
| No. 18 (○) | 60.9 | 30.8 | 8.3  | —   | 100 | 0.0 | 3.73 | 390 | 5.8 | 121 |
| No. 19 (○) | 65.1 | 30.4 | 4.5  | —   | 100 | 0.8 | 3.62 | 325 | 5.8 | 117 |
| No. 20 (○) | 64.3 | 29.9 | 5.8  | —   | 100 | 0.5 | 3.87 | 318 | 5.7 | 119 |

*1 "—" means not detectable in the XRD profile.

TABLE 3

| Experimental Example Nos. ○: Suitable X: Unsuitable | Starting Material Composition (mass %) | | | | | Percentage of SiC Raw Material | | | HP Firing Conditions | |
|---|---|---|---|---|---|---|---|---|---|---|
| | | | | | | Percentage of 32.3 | Percentage of 16.4 | Percentage of 2.9 | Firing Temperature | Pressing Pressure |
| | SiC | TiC | TiSi$_2$ | Si | Total | μm | μm | μm | (° C.) | (Kg/cm$^2$) |
| No. 21 (○) | 51.4 | 33.7 | 14.8 | — | 100 | 0 | 65 | 35 | 1650 | 300 |
| No. 22 (X) | 51.4 | 33.7 | 14.8 | — | 100 | 0 | 65 | 35 | 1700 | 200 |
| No. 23 (○) | 51.4 | 33.7 | 14.8 | — | 100 | 0 | 65 | 35 | 1700 | 250 |
| No. 24 (○) | 51.4 | 33.7 | 14.8 | — | 100 | 0 | 65 | 35 | 1700 | 300 |
| No. 25 (X) | 51.4 | 33.7 | 14.8 | — | 100 | 0 | 65 | 35 | 1750 | 200 |
| No. 26 (○) | 51.4 | 33.7 | 14.8 | — | 100 | 0 | 65 | 35 | 1750 | 250 |
| No. 27 (X) | 53.8 | 32.1 | 14.1 | — | 100 | 0 | 65 | 35 | 1700 | 200 |
| No. 28 (X) | 53.8 | 32.1 | 14.1 | — | 100 | 0 | 65 | 35 | 1700 | 250 |
| No. 29 (X) | 53.8 | 32.1 | 14.1 | — | 100 | 0 | 65 | 35 | 1700 | 300 |
| No. 30 (X) | 53.8 | 32.1 | 14.1 | — | 100 | 0 | 65 | 35 | 1750 | 200 |
| No. 31 (X) | 53.8 | 32.1 | 14.1 | — | 100 | 0 | 65 | 35 | 1750 | 250 |
| No. 32 (X) | 53.8 | 32.1 | 14.1 | — | 100 | 0 | 65 | 35 | 1750 | 300 |
| No. 33 (○) | 43.2 | 44.2 | — | 12.6 | 100 | 0 | 65 | 35 | 1700 | 200 |
| No. 34 (○) | 43.2 | 44.2 | — | 12.6 | 100 | 0 | 65 | 35 | 1725 | 200 |
| No. 35 (○) | 43.2 | 44.2 | — | 12.6 | 100 | 0 | 65 | 35 | 1750 | 200 |
| No. 36 (○) | 43.2 | 44.2 | — | 12.6 | 100 | 0 | 55 | 45 | 1750 | 200 |

| Experimental Example Nos. ○: Suitable X: Unsuitable | Constituent Phase based on XRD (mass %) | | | | | Baseline Characteristics of Sintered Body | | | | |
|---|---|---|---|---|---|---|---|---|---|---|
| | | | | | | Open Porosity | Bulk Density | 4-Point Bending Strength | Linear Thermal Expansion Coefficient | Thermal Conductivity |
| | SiC | TSC | TiC | TiSi$_2$ | Total | (%) | (g/cm$^2$) | (MPa) | (ppm/K) | (W/mK) |
| No. 21 (○) | 67.9 | 27.4 | 4.7 | — | 100 | 0.9 | 3.54 | 310 | 5.5 | 130 |
| No. 22 (X) | 67.5 | 27.1 | 5.4 | — | 100 | 5.7 | 3.37 | 255 | 5.5 | 123 |
| No. 23 (○) | 67.7 | 28.1 | 4.2 | — | 100 | 0.7 | 3.55 | 340 | 5.5 | 131 |
| No. 24 (○) | 66.4 | 27.8 | 5.8 | — | 100 | 0.4 | 3.55 | 341 | 5.4 | 128 |
| No. 25 (X) | 66.2 | 27.2 | 6.6 | — | 100 | 5.3 | 3.38 | 241 | 5.5 | 125 |
| No. 26 (○) | 66.4 | 28.2 | 5.4 | — | 100 | 0.2 | 3.56 | 361 | 5.4 | 130 |
| No. 27 (X) | 68.7 | 26.9 | 4.4 | — | 100 | 14.0 | 3.07 | 185 | 5.3 | 126 |
| No. 28 (X) | 70.1 | 25.1 | 4.8 | — | 100 | 10.1 | 3.21 | 191 | 5.3 | 125 |
| No. 29 (X) | 71.4 | 24.8 | 3.8 | — | 100 | 4.8 | 3.40 | 205 | 5.2 | 130 |
| No. 30 (X) | 70.7 | 25.2 | 4.1 | — | 100 | 12.0 | 3.14 | 179 | 5.2 | 122 |
| No. 31 (X) | 69.5 | 26.3 | 4.2 | — | 100 | 7.1 | 3.32 | 198 | 5.2 | 129 |
| No. 32 (X) | 70.4 | 25.7 | 3.9 | — | 100 | 3.8 | 3.18 | 215 | 5.3 | 131 |
| No. 33 (○) | 62.4 | 29.7 | 7.9 | — | 100 | 0.9 | 3.64 | 335 | 5.8 | 122 |
| No. 34 (○) | 62.0 | 29.9 | 8.1 | — | 100 | 0.4 | 3.68 | 319 | 5.8 | 120 |
| No. 35 (○) | 61.2 | 31.0 | 7.8 | — | 100 | 0.1 | 3.73 | 337 | 5.9 | 119 |
| No. 36 (○) | 61.9 | 30.4 | 7.7 | — | 100 | 0.1 | 3.72 | 333 | 5.8 | 120 |

3. Simple Determination of Constituent Phase

A composite material was ground in a mortar, and a crystal phase in the material was identified with an x-ray diffractometer, The measurement conditions included CuKα, 40 kv, 40 mA, and 2θ=5 to 70 degrees. A sealed-tube X-ray diffractometer (D8 Advance manufactured by Bruker AXS K.K.) was used. The simple determination of the constituent phase was performed. The simple determination determined the crystal phase content of the composite material on the basis of X-ray diffraction peaks. Each of the SiC, TSC (Ti$_3$SiC$_2$), TiC, and TiSi$_2$ contents was independently determined by simple determination. A simplified profile fitting function (FPM Eval.) of powder diffraction data, analysis software "EVA" available from Bruker AXS K.K. was used for the simple determination. This function calculates the quantitative ratio of constituent phases using I/I$_{cor}$ (an intensity ratio relative to the diffraction intensity of corundum) of an ICDD PDF card of an identified crystal phase. The PDF card number of each crystal phase was SiC: 00-049-1428, TSC: 01-070-6397, TiC: 01-070-9258 (TiC0.62), and TiSi$_2$: 01-071-0187. The symbol "..." in Tables 2 and 3 means not detectable in the XRD profile.

4. Measurement of Baseline Characteristics (1) Open Porosity and Bulk Density

The measurement was performed in accordance with Archimedes' principle using pure water as a medium.

(2) Four-Point Bending Strength

The measurement was performed in accordance with JIS-R1601.

(3) Linear Thermal Expansion Coefficient (Average Linear Thermal Expansion Coefficient at Temperature in Range of 40° C. to 50° C.)

A sample was heated twice to 650° C. at a heating rate of 20° C./min with TD5020S (a horizontal differential expansion measurement mode) manufactured by Bruker AXS K.K. in an argon, atmosphere. The average linear thermal expansion coefficient at a temperature in the range of 40° C. to 570° C. was determined from the second measured data. An alumina standard sample attached to the apparatus (a purity of 99.7%, a bulk density of 3.9 g/cm$^3$, and a length of 20 mm)

was used as a standard sample. Another alumina standard sample was prepared. The linear thermal expansion coefficient of the otter alumina standard sample measured under the same conditions was 7.7 ppm/K. The average linear thermal expansion coefficient of an aluminum nitride sintered body in which 5% by weight $Y_2O_3$ as a sintering aid was added to aluminum nitride was 5.7 ppm/K when measured at a temperature in the range of 40° C. to 570° C. under the same conditions. The average linear thermal expansion coefficient of the aluminum nitride sintered body without the sintering aid was 5.2 ppm/K.

(4) Thermal Conductivity

The measurement was performed using a laser flash method.

5. Results (1) Experimental Examples 1 and 2

Blended powders having the same composition were fired, under the same HP firing conditions in experimental examples 1 and 2 except that a SiC raw material having an average particle size of 16.4 μm was used in the experimental example 1, and a SiC raw material having an average particle size of 2.9 μm was used in the experimental example 2. The SiC content of each of the blended powders was 41.2 mass %. As a result, in the experimental examples 1 and 2, a dense composite material having an open porosity of 0% was produced, but the difference in thermal expansion coefficient from aluminum nitride was more than 0.5 ppm/K. This is probably because an excessively small amount of SiC raw material was used In the experimental examples 1 and 2, and the SiC content of the dense composite material was as low as 47 to 49 mass %, and therefore the thermal expansion coefficient was not sufficiently reduced.

(2) Experimental Examples 3 to 6

Figure 9:
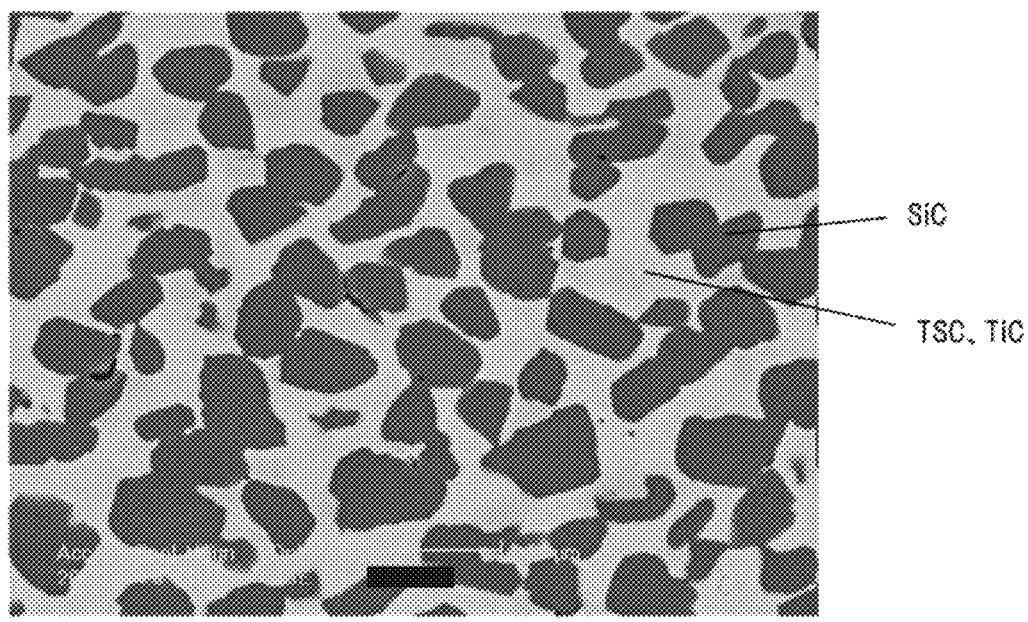
FIG. 9 shows a SEM image (backscattered electron image) of the dense composite material produced in the experimental example 5.
Figure 10:
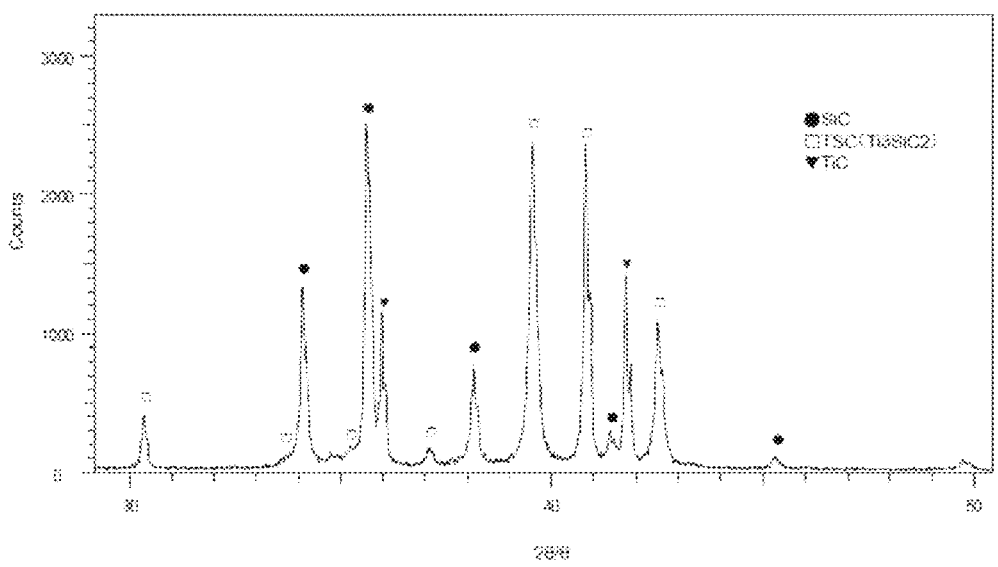
FIG. 10 shows an XRD profile of the dense composite material produced in the experimental example 5.

In experimental examples 3 to 5, blended powders having the same raw material composition were fired under different HP firing conditions. The SiC raw material had an average particle size of 16.4 μm. The SiC content of each of the blended powders was 43.1 mass %. As a result, the dense composite materials produced in the experimental examples 3 to 5 had a SiC content in the range of 51. to 53 mass %, an open porosity of 0%, and a thermal expansion coefficient of 6.0 ppm/K. The dense composite materials had a four-point bending strength of 300 MPa or more and a thermal conductivity of 100 W/m·K or more. In an experimental example 6, a blended powder having the same raw material composition as the experimental example 5 except that a SiC raw material having an average particle size of 2.9 μm. was used was fired under the same HP firing conditions as the experimental example 5. As a result, the dense composite material produced in the experimental example 6 had substantially the same performance as the dense composite material produced in the experimental example 5. FIGS. 9 and 10 show a SEM image (backscattered electron image) and an XRD profile of the dense composite material produced in the experimental example 5 as a representative example. FIG. 9 shows that at least one of TSC and TiC covers the surface of the SiC particles. Similar SEM images and XRD profiles were obtained in the other experimental examples.

(3) Experimental Examples 7 to 12

In experimental examples 7 to 12, blended powders having the same raw material composition were fired under different HP firing conditions. The SiC raw material had an average particle size of 16.4 μm. The SiC content of each of the blended powders was 49.2 mass %. As a result, the dense composite materials produced in the experimental examples 7, 10, and 12 had a SiC content in the range of 59 to 64 mass %, an open porosity in. the range of 0.2% to 0.9%, and a thermal expansion, coefficient of 5.8 ppm/K. The dense composite materials had a four-point bending strength of 300 MPa or more and a thermal conductivity of 100 W/m·K or more. Composite materials produced in the experimental examples 8, 9, and 11 had a thermal expansion coefficient of 5.8 ppm/K and an open porosity of more than 1%. The high open porosity is probably because of an insufficient pressing pressure, although the HP firing temperature was 1700° C. in the experimental examples 8 and 9 and 1750° C. in the experimental example 11. The SEM images and XRD profiles of the experimental examples 7, 10, and 12 were similar to those shown in FIGS. 9 and 10.

(4) Experimental Examples 13 to 18

Figure 11:
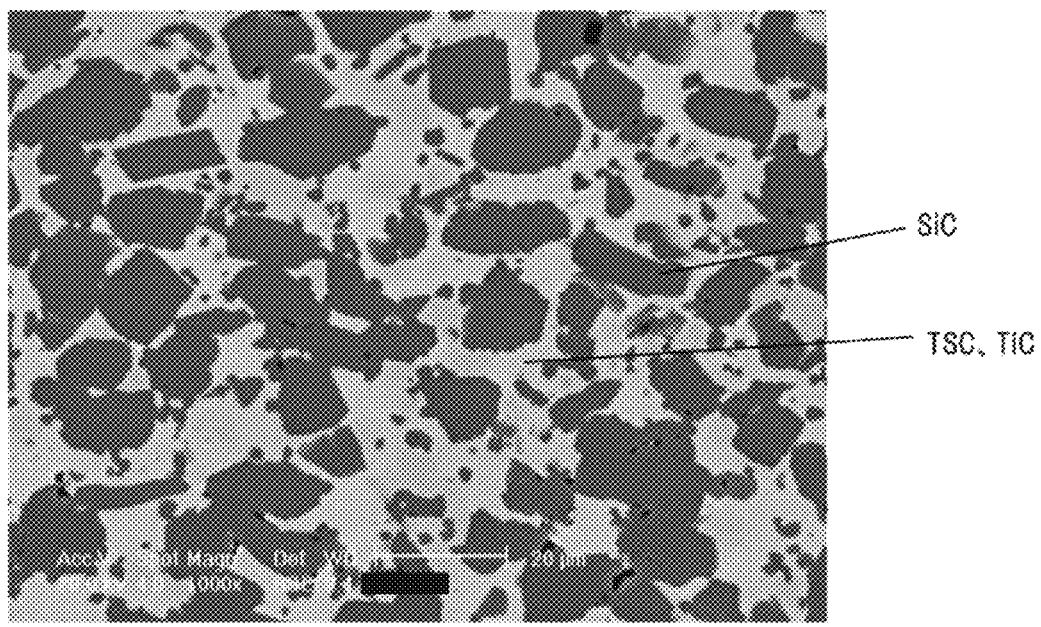
FIG. 11 shows a SEM image (backscattered electron image) of a dense composite material produced in the experimental example 15.
Figure 12:
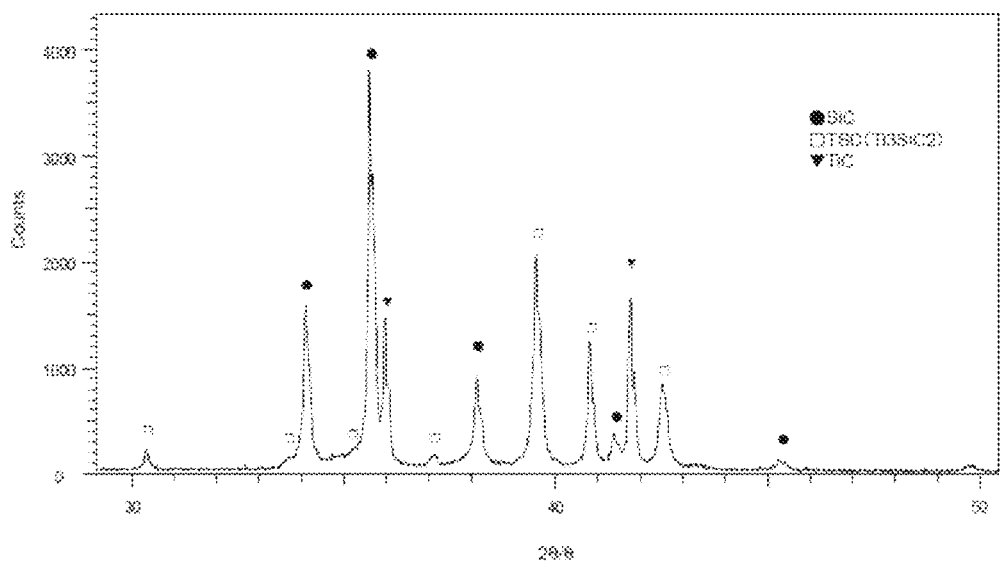
FIG. 12 shows an XRD profile of the dense composite material produced in the experimental example 15.

In experimental examples 13 to 18, blended powders containing a mixed SiC and having the same raw material composition were fired under different HP firing conditions. The mixed SiC was prepared by mixing a SiC raw material having an average particle size of 16.4 μm and a SiC raw material having an average particle size of 2.9 μm at 65:35 (mass ratio). The SiC content of each of the blended powders was 49.2 mass %. As a result, the dense composite materials produced in the experimental examples 13, 15, 16, and 18 had a SiC content in the range of 60 to 63 mass %, an open porosity in the range of 0% to 0.9%, and a thermal expansion coefficient in the range of 5.7 to 5.8 ppm/K. The dense composite materials had a four-point, bending strength of 300 MPa or more and a thermal conductivity of 100 W/m·K or more. Composite materials produced in the experimental examples 14 and 17 had a thermal expansion coefficient In the range of 5.7 to 5.8 ppm/K and an open porosity of more than 1%. The high open porosity is probably because of an insufficient pressing pressure, although the HP firing temperature was 1700° C. in the experimental example 14 and 1725° C. in the experimental example 17. FIGS. 11 and 12 show a SEM image (backscattered electron image) and an XRD profile of the dense composite material produced in the experimental example 15 as a representative example. FIG. 11 shows that at least one of TSC and TiC covers the surface of the SiC particles. The SEM images and XRD profiles of the experimental examples 13, 16, and 18 were similar to those shown in FIGS. 11 and 12.

In the experimental examples 15 and 9, the blended powders having the same raw material composition except that a SiC raw material composed of coarse particles and fine particles was used in the experimental example 15, and a SiC raw material composed of coarse particles alone was used in the experimental example 9 were fired under the same HP firing conditions. As a result, a sintered body produced in the experimental example 9 was not sufficiently densified (an open porosity of 1.9%), whereas a sintered body produced in the experimental example 15 was sufficiently densified (an open porosity of 0.4%). This result shows that the use of the SiC raw material composed of coarse particles and fine particles tends to result in higher densification than the use of the SiC raw material composed of coarse particles alone.

(5) Experimental Examples 19 and 20

In experimental examples 19 and 20, blended powders having the same raw material composition except that different SiC raw materials were used were fired under the same HP firing conditions. The SiC in the experimental example 19 was prepared by mixing a SiC raw material having an average particle size of 32.3 μm and a SiC raw material having an average particle size of 2.3 μm at 65:35 (mass ratio). The SiC in the experimental example 20 was prepared by mixing a SiC raw material having an average particle size of 32.3 μm and a SiC raw material having an average particle size of 2.9 μm at 55:45 (mass ratio). The SiC content of each of the blended powders was 49.2 mass %. As a result, the dense composite materials thus produced had a SiC content in the range of 64 to 66 mass %, an open porosity in the range of 0.5% to 0.8%, and a thermal expansion coefficient in the range of 5.7 to 5.8 ppm/K. The dense composite materials had a four-point bending strength of 300 MPa or more and a -thermal conductivity of 100 W/m·K or more. The SEM images and XRD profiles of the experimental examples 19 and 20 were similar to those shown in FIGS. 11 and 12.

In the experimental examples 17 and 19, the blended powders having the same raw material composition except that a SiC raw material having an average particle size of 16.4 μm was used in the experimental example 17, and a SiC raw material having an average particle size of 32.3 μm was used in the experimental example 19 were fired under the same HP firing conditions. As a result, a sintered body produced in the experimental example 17 was not sufficiently densified (an open porosity of 1.7%), whereas a sintered body produced in the experimental example 19 was sufficiently densified (an open porosity of 0.8%). This result shows that the use of a SiC raw material composed of coarse particles having a large average particle size tends to result in higher densification than, the use of a SiC raw material composed of coarse particles having a small average particle size. Particularly when a large amount of SiC raw material is used, an increase in the amount of SiC composed of coarse particles is effective for densification.

(6) Experimental Examples 21 to 26

In experimental examples 21 to 26, blended powders containing a mixed SiC and having the same raw material composition were fired under different HP firing conditions. The mixed SiC was prepared by mixing a SiC raw material having an average particle size of 16.4 μm and a SiC raw material having an average particle size of 2.9 μm at 65:35 (mass ratio). The SiC content of each of the blended powders was 51.4 mass %. As a result, the dense composite materials produced in the experimental examples 21, 23, 24, and 26 had a SiC content in the range of 66 to 68 mass %, an open porosity in the range of 0.2% to 0.9%, and a thermal expansion coefficient in the range of 5.4 to 5.5 ppm/K. The dense composite materials had a four-point bending strength of 300 MPa or more and a thermal conductivity of 100 W/m·K or more. Composite materials produced in the experimental examples 22 and 25 had a thermal expansion coefficient of 5.5 ppm/K and an open porosity of more than 1%. The high open porosity is probably because of an insufficient pressing pressure although the HP firing temperature was 1700° C. in the experimental example 22 and 1750° C. in the experimental example 25. The SEM images and XRD profiles of the experimental examples 21, 23, 24, and 26 were similar to those shown in FIGS. 11 and 12.

(7) Experimental Examples 27 to 32

In experimental examples 27 to 32, blended powders containing a mixed SiC and having the same raw material composition were fired under different HP firing conditions. The mixed SiC was prepared by mixing a SiC raw material having an average particle size of 16.4 μm and a SiC raw material having an average particle size of 2.9 μm at 65:35 (mass ratio). The SiC content of each of the blended powders was 53.8 mass %. As a result, the composite materials produced in the experimental examples 27 to 32 had a SiC content in the range of 68 to 72 mass % and a thermal expansion coefficient in the range of 5.2 to 5.3 ppm/K but had an open, porosity of more than 1%. The high open porosity in the experimental examples 27 to 32 is probably because of an excessively large amount of SiC raw material and insufficient sintering in the HP firing.

(8) Experimental Examples 33 to 36

In experimental examples 33 to 36, $TiSi_2$ was not used as a raw material, but Tie, Si, and SiC were used as raw materials. The SiC was prepared by mixing a SiC raw material having an average particle size of 16.4 μm and a SiC raw material having an average particle size of 2.9 μm at 65:35 (mass ratio). A blended powder having a raw material composition of SiC: TiC:Si=43.2:44.2:12.6 (mass ratio) was fired under different HP firing conditions. As a result, the dense composite materials thus produced had a Sic content in the range of 61 to 63 mass %, an open porosity in the range of 0.1% to 0.9%, and a thermal expansion coefficient in the range of 5.8 to 5.9 ppm/K. The dense composite materials had a four-point bending strength of 300 MPa or more and a thermal conductivity of 100 W/m·K or more.

In the experimental examples 14 and 17 and the experimental examples 33 and 34, blended powders containing different raw materials and having different compositions were fired under the same HP firing conditions. As a result, the sintered bodies produced in the experimental examples 14 and 17 were not sufficiently densified, whereas the sintered bodies produced in the experimental examples 33 and 34 were sufficiently densified. The SIC contents of the sintered bodies were substantially the same in the experimental examples 33 and 34 and the experimental examples 14 and 17. Thus, it was found that densification tended to be promoted by reducing the amounts of SiC and $TiSi_2$ in the raw materials and adjusting the amounts of Si, Ti, and C components using TiC and Si raw materials having smaller average particle sizes than $TiSi_2$.

(9) Summary

The dense composite materials produced in the experimental examples 3 to 7, 10, 12, 13, 15, 16, 18 to 21, 23, 24, 26, and 33 to 36 had an open porosity of 1% or less, substantially the same linear thermal expansion coefficient as aluminum nitride (5.4 to 6.0 ppm/K at a temperature in the range of 40° C. to 570° C.), and sufficiently high thermal conductivity, denseness, and strength. Thus, a member for a semiconductor manufacturing apparatus that is formed by metal bonding of a first plate material formed of such a dense composite material, and a. second plate material, formed of aluminum nitride has a long life without separation between the first member and the second member even when the member is repeatedly used, between low temperatures and high, temperatures. These experimental examples show that a blended powder for use in the production of a dense composite material contains 43 to 52 mass % SiC, 33 to 45 mass % TiC, and 14 to 18 mass % $TiSi_2$, and the dense composite material contains SI to 68 mass % SiC, 27 to 40 mass % TSC, and. 4 to 12 mass % TiC. The results of the experimental examples 33 to 36 show that part or all of the SiC and TiSi$_2$ raw materials may be substituted with Tic and Si raw materials to form a dense composite material having substantially the same characteristics. In this case, the blended powder contains 43 to 52 mass % Sic, 33 to 45 mass % titanium carbide, and the remainder of 18 mass % or less titanium, silicide and/or 13 mass % or less Si.

The present application claims priority from Japanese Patent. Application No. 2013-061356 filed on Mar. 25, 2013, the entire contents of which are incorporated herein by reference.

INDUSTRIAL APPLICABILITY

A cooling plate according to the present invention can be used as a cooling plate bonded to an aluminum nitride electrostatic chuck or susceptor by metal bonding.

What is claimed is:

1. A cooling plate for cooling an AlN ceramic member, the cooling plate having an internal refrigerant path and comprising:
   a first substrate formed of a dense composite material, the dense composite material containing the following three compounds with the highest contents: silicon carbide, titanium silicon carbide, and titanium carbide, in descending order of their contents, the silicon carbide content being in the range of 51 to 68 mass %, the dense composite material containing no titanium silicide, the open porosity of the dense composite material being 1% or less;
   a second substrate formed of the dense composite material and having a punched portion, the punched portion having the same shape as the refrigerant path;
   a third substrate formed of the dense composite material;
   a first metal bonding layer between, the first substrate and the second substrate formed by thermal compression bonding of the first substrate and the second substrate with a metal bonding material interposed therebetween; and
   a second metal bonding layer between, the second substrate and the third substrate formed by thermal compression bonding of the second substrate and the third substrate with a metal bonding material interposed therebetween.

2. The cooling plate according to claim 1, wherein the metal bonding layer contains as the metal bonding material an aluminum alloy bonding material containing Mg or Si and Mg and is formed by thermal compression bonding at a temperature lower than or equal to the solidus temperature of the bonding material.

3. The cooling plate according to claim 1, wherein the titanium silicon carbide content of the dense composite material is in the range of 23 to 40 mass %, and the titanium carbide content of the dense composite material ranges from 4 to 12 mass %.

4. The cooling plate according to claim 1, wherein at least one of the titanium silicon carbide and the titanium carbide in the dense composite material is disposed between, the silicon carbide particles and covers the surface of the silicon carbide particles.

5. The cooling plate according to claim 1, wherein the difference In average linear thermal expansion coefficient between the dense composite material and AlN is 0.5 ppm/K or less at a temperature in the range of 40° C. to 570° C.

6. The cooling plate according to claim 1, wherein the dense composite material has an average linear thermal expansion coefficient in the range of 5.4 to 6.0 ppm/K at a temperature in the range of 40° C. to 570° C.

7. The cooling plate according to claim 1, wherein the dense composite material has a thermal conductivity of 100 W/m·K or more and a four-point bending strength of 300 MPa or more.

8. A cooling plate for cooling an AlN ceramic member, the cooling plate having an internal refrigerant path and comprising:
   a first substrate formed of a dense composite material, the dense composite material containing the following three compounds with the highest contents; silicon carbide, titanium silicon carbide, and titanium carbide, in descending order of their contents, the silicon carbide content being in the range of 51 to 68 mass %, the dense composite material containing no titanium, silicide, the open porosity of the dense composite material being 1% or less;
   a second substrate formed of the dense composite material and having a groove for the refrigerant path on a surface thereof facing the first substrate; and
   a metal bonding layer formed by thermal compression bonding of the first substrate and the second substrate with a metal bonding material interposed between the first substrate and the surface of the second substrate in which the groove is formed.

9. The cooling plate according to claim 8, wherein the metal bonding layer contains as the metal bonding material an aluminum alloy bonding material containing Mg or Si and Mg and is formed by thermal compression bonding at a temperature lower than or equal to the solidus temperature of the bonding material.

10. The cooling plate according to claim 8, wherein the titanium silicon carbide content of the dense composite material is in the range of 23 to 40 mass %, and the titanium carbide content of the dense composite material ranges from 4 to 12 mass %.

11. The cooling plate according to claim 8, wherein at least one of the titanium silicon carbide and the titanium carbide in the dense composite material is disposed between the silicon carbide particles and covers the surface of the silicon carbide particles.

12. The cooling plate according to claim 8, wherein the difference in average linear thermal expansion coefficient between the dense composite material and AlN is 0.5 ppm/K or less at a temperature in the range of 40° C. to 570° C.

13. The cooling plate according to claim 8, wherein the dense composite material has an average linear thermal expansion coefficient in the range of 5.4 to 6.0 ppm/K at a temperature in the range of 40° C. to 570° C.

14. The cooling plate according to claim 8, wherein the dense composite material has a thermal conductivity of 100 W/m·K or more and a four-point bending strength of 300 MPa or more.

15. A method for manufacturing a cooling plate for cooling an AlN ceramic member, the cooling plate having an internal refrigerant path, the method comprising the steps of:
   (a) forming first to third substrates from a dense composite material, the dense composite material containing the following three compounds with the highest contents: silicon carbide, titanium silicon carbide, and titanium carbide, in descending order of their contents, the silicon carbide content being in the range of 51 to 68 mass %, the dense composite material containing no titanium silicide, the open porosity of the dense composite material being 1% or less;
   (b) forming a punched portion in the second substrate by punching the second substrate from one surface to the other surface of the second substrate such that the punched portion has the same shape as the refrigerant path; and (c) performing thermal compression bonding of the first to third substrates with a metal bonding material interposed between the first substrate and one surface of the second substrate and between the third substrate and the other surface of the second substrate.

16. The method for manufacturing a cooling plate according to claim 15, wherein the metal bonding material in the step (c) is an aluminum alloy bonding material containing Mg or Si and Mg, and the thermal compression bonding is performed at a temperature lower than or equal to the solidus temperature of the bonding material.

17. A method for manufacturing a cooling plate for cooling an AlN ceramic member, the cooling plate having an internal refrigerant path, the method comprising the steps of:

(a) forming first and second substrates from a dense composite material, the dense composite material containing the following three compounds with the highest contents: silicon carbide, titanium silicon carbide, and titanium carbide, in descending order of their contents, the silicon carbide content being in the range of 51 to 68 mass %, the dense composite material containing no titanium silicide, the open porosity of the dense composite material being 1% or less;

(b) forming a groove for the refrigerant path in one surface of the second substrate; and (c) performing thermal compression bonding of the first substrate and the second substrate with a metal bonding material interposed between the first substrate and the surface of the second substrate in which the groove is formed.

18. The method for manufacturing a cooling plate according to claim 17, wherein the metal bonding material in the step (c) is an aluminum alloy bonding material containing Mg or Si and Mg, and the thermal compression, bonding is performed at a temperature lower than or equal to the solidus temperature of the bonding material.

19. A member for a semiconductor manufacturing apparatus, comprising:
an AlN electrostatic chuck including an electrostatic electrode and a heater electrode;
the cooling plate according to claim 1; and
a cooling plate-chuck bonding layer formed by thermal compression bonding of the first substrate and the electrostatic chuck with a metal bonding material interposed between a surface of the first substrate of the cooling plate and the electrostatic chuck.

20. The member for a semiconductor manufacturing apparatus according to claim 19, wherein the cooling plate-chuck bonding layer contains as the metal bonding material an aluminum alloy bonding material containing Mg or Si and Mg and is formed by thermal compression bonding at a temperature lower than or equal to the solidus temperature of the bonding material.

21. A member for a semiconductor manufacturing apparatus, comprising:
an AlN electrostatic chuck including an electrostatic electrode and a heater electrode;
the cooling plate according to claim 8; and
a cooling plate-chuck bonding layer formed by thermal compression bonding of the first substrate and the electrostatic chuck with a metal bonding material interposed between a surface of the first substrate of the cooling plate and the electrostatic chuck.

22. The member for a semiconductor manufacturing apparatus according to claim 21, wherein the cooling plate-chuck bonding layer contains as the metal bonding material an aluminum alloy bonding material containing Mg or Si and Mg and is formed by thermal compression bonding at a temperature lower than or equal to the solidus temperature of the bonding material.

* * * * *